(12) United States Patent
Morishita et al.

(10) Patent No.: US 7,764,540 B2
(45) Date of Patent: Jul. 27, 2010

(54) SEMICONDUCTOR MEMORY DEVICE

(75) Inventors: Fukashi Morishita, Tokyo (JP); Kazutami Arimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 148 days.

(21) Appl. No.: 12/281,271

(22) PCT Filed: Mar. 1, 2006

(86) PCT No.: PCT/JP2006/303874

§ 371 (c)(1),
(2), (4) Date: Aug. 29, 2008

(87) PCT Pub. No.: WO2007/099623

PCT Pub. Date: Sep. 7, 2007

(65) Prior Publication Data

US 2009/0022001 A1 Jan. 22, 2009

(51) Int. Cl.
G11C 11/34 (2006.01)

(52) U.S. Cl. .................. 365/180; 365/189.03; 365/104

(58) Field of Classification Search ................ 365/180, 365/189.03, 104, 230.05, 226, 227, 231, 365/185.27, 185.25

See application file for complete search history.

(56) References Cited

U.S. PATENT DOCUMENTS 5,563,827 A * 10/1996 Lee et al. ............... 365/185.23
6,087,893 A    7/2000 Oowaki et al.
6,154,405 A * 11/2000 Takemae et al. ....... 365/185.24
6,449,204 B1   9/2002 Arimoto et al.
6,529,434 B2   3/2003 Kitamoto et al.
2002/0021609 A1 2/2002 Kitamoto et al.
2003/0103368 A1 6/2003 Arimoto et al.

FOREIGN PATENT DOCUMENTS

| JP | 61-80700 | 4/1986 |
|---|---|---|
| JP | 10-135814 | 5/1998 |
| JP | 2002-63788 | 2/2002 |
| JP | 2002-170386 | 6/2002 |
| WO | WO 2005/122244 A1 | 12/2005 |

OTHER PUBLICATIONS

Morishita, F., et al., "A Capacitorless Twin-Transistor Random Access Memory (TTRAM) on SOI", IEEE 2005 Custom Integrated Circuits Conference, 2005, pp. 435-438, IEEE.

* cited by examiner

*Primary Examiner*—Dang T Nguyen
(74) *Attorney, Agent, or Firm*—McDermott Will & Emery LLP

(57) ABSTRACT

By activating a word line and a bit line in parallel with a storage transistor set to OFF, the potential conditions of the charge line, and the word line, and the bit line are controlled so that the potential of a body region is increased by a leak current flowing from a connecting node to the body region in a period until the storage transistor is turned ON.

24 Claims, 28 Drawing Sheets

F I G . 5
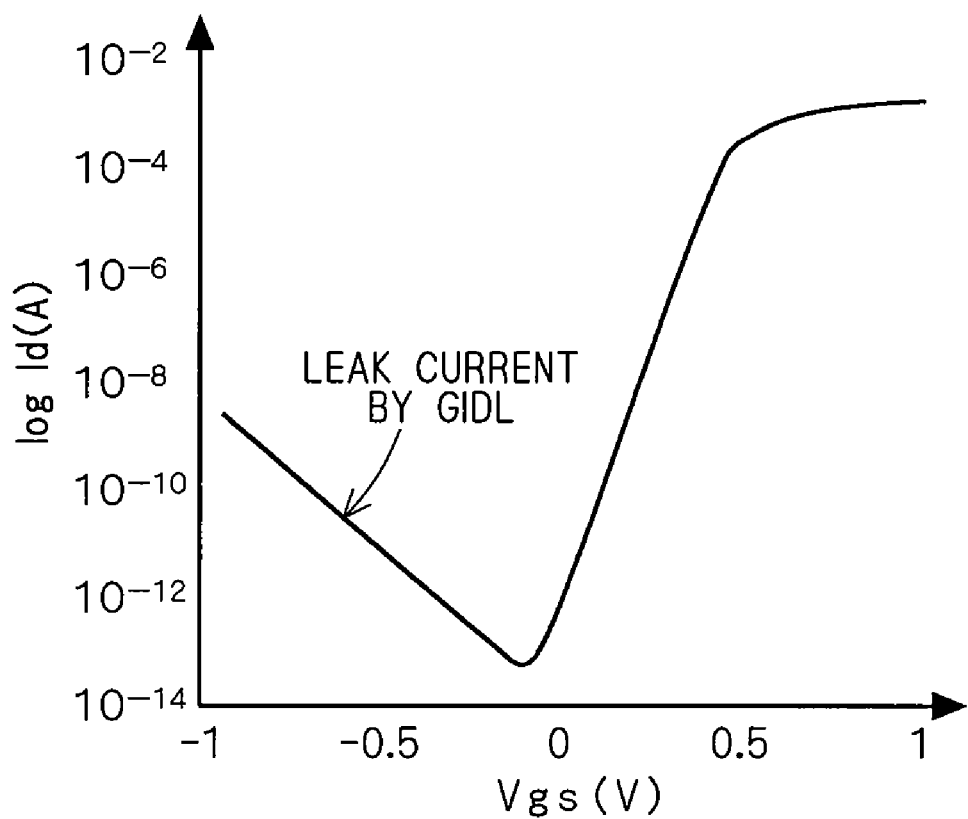

F I G . 1 5
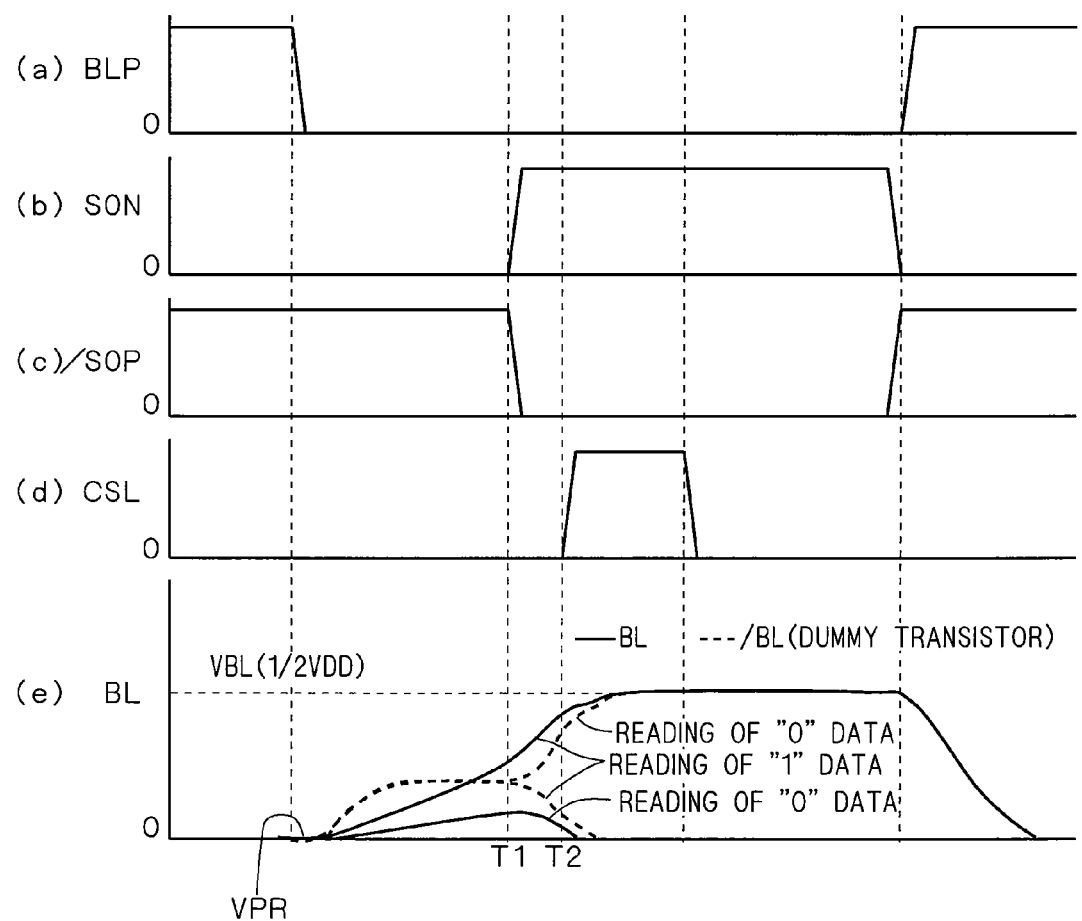

F I G . 1 9
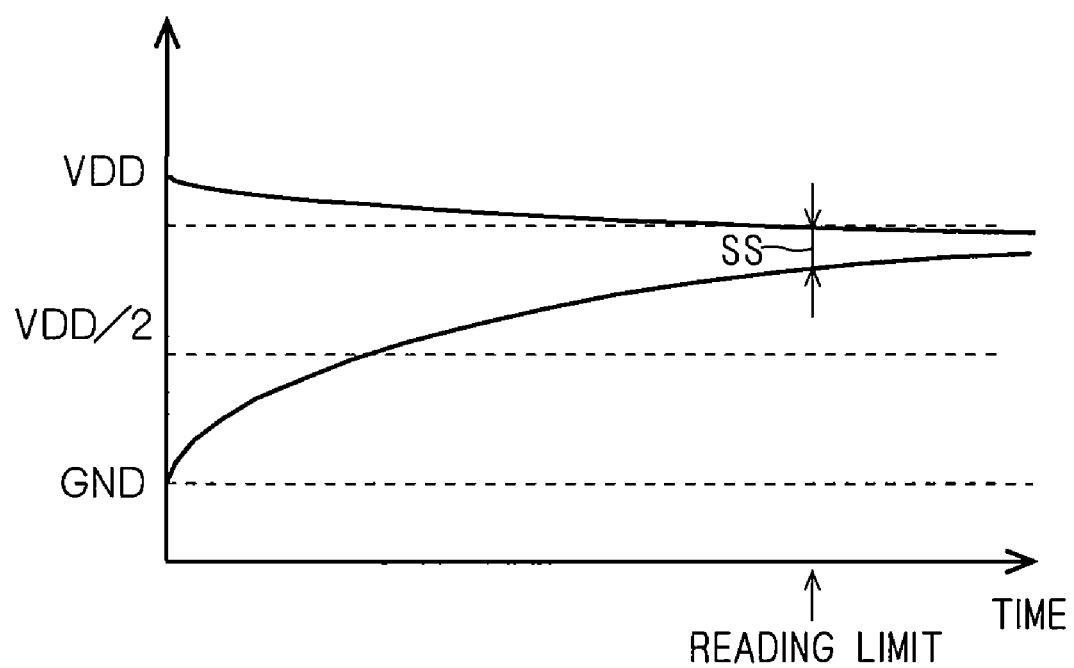

FIG. 27

MODE CHANGE-OVER SIGNAL "H" (1-BIT 1-CELL)

| AD | WL (CL) | DWL (DCL) |
|---|---|---|
| 1 0 | 3 2 1 0 | 1 0 |
| L L | L L L H | H L |
| L H | L L H L | L H |
| H L | L H L L | H L |
| H H | H L L L | L H |

FIG. 28

MODE CHANGE-OVER SIGNAL "L" (1-BIT 2-CELL)

| AD | WL (CL) | DWL (DCL) |
|---|---|---|
| 1 0 | 3 2 1 0 | 1 0 |
| L d | L L H H | L L |
| H d | H H L L | L L |

SEMICONDUCTOR MEMORY DEVICE

RELATED APPLICATIONS

This application is the U.S. National Phase under 35 U.S.C. §371 of International Application No. PCT/JP2006/303874, filed on Mar. 1, 2006, the disclosure of which Applications is incorporated by reference herein.

TECHNICAL FIELD

The present invention relates to a semiconductor memory device, and more particularly to a dynamic memory capable of random access.

BACKGROUND ART

In system LSI of recent years, a variety of methods for achieving both high speed operation and low power consumption have been proposed and dynamic voltage control and frequency control are very effective methods.

That is, this is a method for reducing total consumption power by operating at a high frequency by raising the voltage at a high speed operation time and at a low frequency by lowering the voltage at a time when such high speed operation is not needed or for a block which does not need the high speed operation.

Although the above-described dynamic control on the voltage and frequency can be applied to a general logic circuit, it cannot be applied to a memory for a following reason, which is a problem for reduction of consumption power of an entire system.

That is, in case of SRAM (Static Random Access Memory), because static noise margin drops as the power source voltage is lowered, the voltage cannot be lowered even if the operating frequency is low.

On the other hand, in case of DRAM (Dynamic Random Access Memory), if power source voltage is lowered, the quantity of accumulated charges is reduced so that there is a possibility that no operating margin can be obtained or soft error resistance is lowered largely. Thus, the voltage cannot be lowered.

Here, recently, for example, a memory called twin transistor RAM (TTRAM: Twin-Transistor Random Access Memory) has been proposed, as disclosed in non-patent document 1.

Non-patent document 1: IEEE205 CUSTOM INTEGRATED CIRCUIT CONFERENCE pp 435-438, "A Capacitorless Twin-Transistor Random Access Memory (TTRAM) on SOL", Fukashi Morishita et al.

As indicated in the non-patent document 1, in the TTRAM, a memory cell is constituted by a structure in which a storage transistor having a storage node and an access transistor are connected in series. By changing the state of floating substrate potential of the storage transistor, memory of data is achieved and thus, a structure not requiring any capacitor for memorizing data is provided.

That is, the storage transistor uses a body region below a channel formation region as the storage node and produces a state in which a hole is accumulated (state in which the threshold voltage of the storage transistor is low) and a state in which no hole is accumulated (state in which the threshold voltage is high) to memorize data "1" and data "0" respectively.

The state in which no hole is accumulated in the storage node is produced when the storage node is lowered from high level to low level by gate coupling (capacitance coupling generated between the gate and body) and the state in which a hole is accumulated in the storage node is produced when the potential of the storage node is raised by gate coupling.

DISCLOSURE OF THE INVENTION

As described above, in the TTRAM, data writing is carried out using gate coupling in the storage transistor. In recent years when miniaturization of the transistor has been accelerated, it is expected that an effective gate capacity is lowered and it is expected that a trouble may occur in writing data "1".

In the TTRAM, when the power source voltage is lowered, there is a possibility that the quantity of the accumulated charges is reduced so that the operating margin cannot be obtained. Thus, to achieve both high speed operation and low consumption power by the dynamic control of the voltage and frequency, any technical measure is required.

The present invention has been achieved to solve the above-described problem and an object of the invention is to provide a TTRAM which causes no trouble in data writing even if the miniaturization of the transistor is accelerated and a TTRAM capable of dynamic control of the voltage and frequency.

A first aspect of the semiconductor memory device of the present invention exists in a semiconductor memory device including a memory array portion having a plurality of memory cells arranged in a matrix, charge line, word line and bit lines, in which each of the plurality of the memory cells has an access transistor and a storage transistor connected in series between one of the bit lines and the power source potential, the gate of the storage transistor is connected to the charge line and the gate of the access transistor is connected to the word line, the storage transistor and the access transistor are isolated electrically from adjoining other memory cells, by switching the potential of a connection node of the storage transistor and the access transistor to a constant potential or a floating condition by turning ON/OFF the access transistor, the potential of a body region of the storage transistor is set to a high level or a low level so as to memorize binary data, wherein by activating the word line and one of the bit lines in parallel with the storage transistor set to OFF, the potential conditions of the charge line, the word line and one of the bit lines are controlled so that the potential of the body region is raised by a leak current flowing from the connecting node toward the body region in a period until the storage transistor is turned ON.

According to the first aspect of the semiconductor memory device of the present invention, by activating the word line and the bit line in parallel with the storage transistor set to off, the potential conditions of the charge line, the word line and the bit line are controlled so as to raise the potential of the body region by a leak current flowing from the connecting node to the body region in a period until the storage transistor is turned ON. Consequently, the charges can be accumulated efficiently as compared with a case of accumulating charges by raising the potential of the body region by only gate coupling, so that the quantity of charges corresponding to writing of data "1" can be obtained securely.

A second aspect of the semiconductor memory device of the present invention exists in a semiconductor memory device including a memory array portion having a plurality of memory cells arranged in a matrix, charge line, word line and lines, in which each of the plurality of the memory cells has an access transistor and a storage transistor connected in series between one of the bit lines and the power source potential, the gate of the storage transistor is connected to the charge line and the gate of the access transistor is connected to the word line, the storage transistor and the access transistor are isolated electrically from adjoining other memory cells, by switching the potential of a connection node of the storage transistor and the access transistor to a constant potential or a floating condition by turning ON/OFF the access transistor, the potential of a body region of the storage transistor is set to a high level or a low level so as to memorize binary data, wherein, the bit line is disposed such that a first bit line and a second bit line make a pair, the plurality of the memory cells include a first memory cell in which the access transistor is connected to the first bit line, and a second memory cell in which the access transistor is connected to the second bit line, the memory array portion includes a first reference potential applying means for providing a reference potential to the first bit line and a second reference potential applying means for providing the reference potential to the second bit line, the semiconductor memory device further comprising a program unit which programs a combination of signals to be provided to control lines of the charge line, the word line, and the first and second reference potential applying means and uses the plurality of the memory cells as a 1-bit 2-cell type memory cells for memorizing 1-bit information with two memory cells or 1-bit 1-cell type memory cells for memorizing 1-bit information with a memory cell.

The second embodiment of the semiconductor memory device of the present invention includes a program unit which programs a combination of signals to be provided to the charge line, the word line and the control lines of the first and second reference potential applying means and uses the plurality of the memory cells as the 1-bit 2-cell type memory cell or 1-bit 1-cell type memory cell. Consequently, the memory array can be used as a configurable unified memory.

The object, feature, aspects and advantages of the present invention will become evident from following detailed description and the accompanying drawings.

BRIEF DESCRIPTION OF THE DRAWINGS

FIG. 5 is a diagram showing the relation between a gate voltage and a drain current of the MOS transistor.

FIG. 15 is a timing chart for explaining a reading operation of data from the memory array according to the third embodiment of the present invention.

FIG. 19 is a diagram showing changes in held data in a 1-bit 2-cell type TTRAM.

FIG. 27 is a diagram showing an output with respect to an input in the program unit.

FIG. 28 is a diagram showing an output with respect to an input in the program unit.

BEST MODE FOR CARRYING OUT THE INVENTION

Prior to description of the embodiments of the present invention, the basic configuration of the TTRAM will be described.

Figure 1:
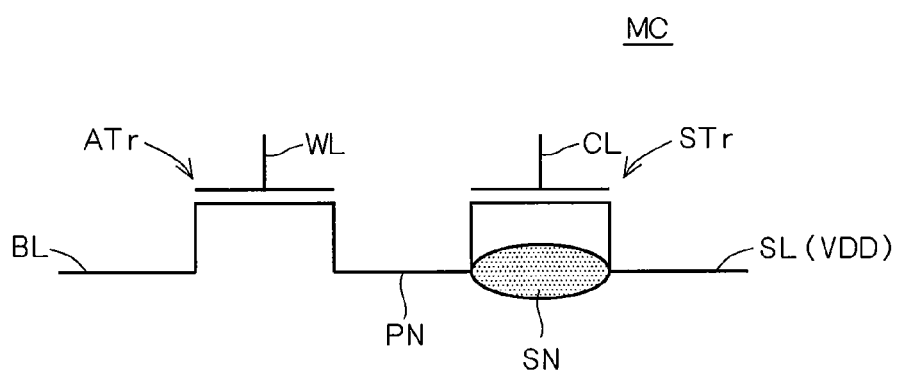
FIG. 1 is an equivalent circuit schematic of a memory cell which is a configuration unit of the TTRAM.

FIG. 1 is an equivalent circuit schematic showing a memory cell MC which is a constitutional unit of the TTRAM. As shown in FIG. 1, the memory cell MC has a structure in which a storage transistor STr having a storage node SN and an access transistor ATr are connected in series through a node PN (connecting node).

A word line WL is connected to the gate of an access transistor ATr and a bit line BL is connected to the source. A charge line CL is connected to the gate of the storage transistor STr and a source line SL is connected to the drain, so as to supply power source potential VDD to the source line SL. Although FIG. 1 shows an example that the memory cell MC is constituted of N-channel type MOS transistor (NMOS transistor), it should be understood that it may be constituted of P-channel type MOS transistor (PMOS transistor). In this case, electrons are accumulated in the storage node SN.

Figure 2:
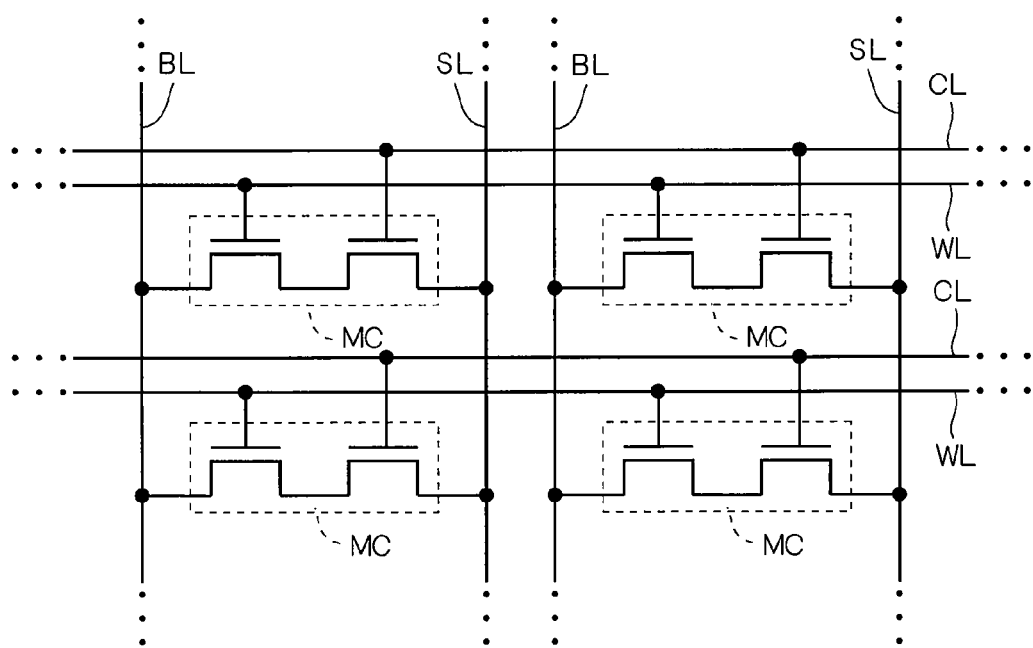
FIG. 2 is a circuit diagram showing a partially extracted portion of the memory array of the TTRAM.

FIG. 2 is a circuit diagram showing a part extracted from an example of the structure of the memory cell array in which the memory cells MC shown in FIG. 1 are arranged in a matrix.

As shown in FIG. 2, the memory cell array includes a plurality of charge lines CL and word lines which are extended in the direction of a row (Row: row) and disposed alternately in parallel and a plurality of bit lines BL and source lines which are extended in the direction of a column (Column: column) and disposed alternately in parallel.

The charge lines CL and the word lines WL are shared by the plurality of the memory cells MC arranged in the direction of the row and the bit lines BL and the source lines SL are shared by the plurality of the memory cells MC arranged in the column direction. Then, the memory cell MC is disposed at an intersection between the charge line CL and the word line WL and between the bit line BL and the source line SL.

Figure 3:
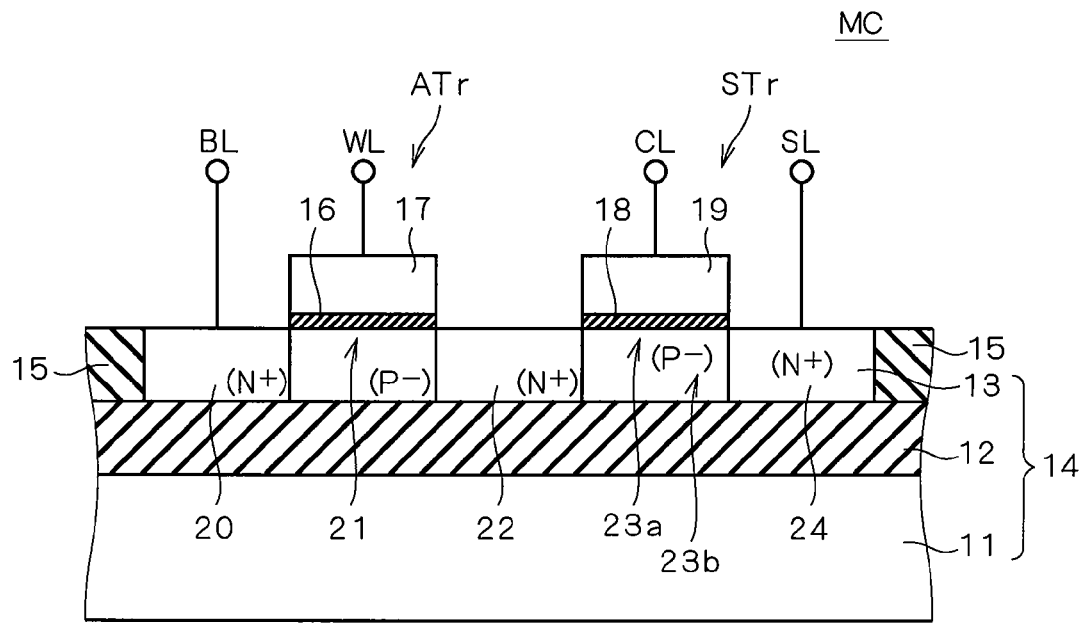
FIG. 3 is a sectional view showing the structure of the memory cell of the TTRAM.

FIG. 3 shows the sectional structure of the memory cell MC. As shown in FIG. 3, the memory cell MC is formed on a SOI substrate 14 in which a silicon substrate 11, buried oxide film 12 and a silicon layer 13 (SOI layer) are overlaid in this order.

The storage transistor STr has impurity-diffused regions 22, 24 containing N type impurity at a relatively high concentration ($N^+$), a gate oxide film 18 and a gate electrode 19.

The impurity-diffused regions 22, 24 are formed from the top face of the silicon layer 13 to reach the top face of the buried oxide film 12 and the gate electrode 19 is disposed on the silicon layers 13 between the both regions through the gate oxide film 18.

Here, the silicon layer 13 between the impurity-diffused regions 22 and 24 is called body region and the surface thereof serves as a channel region 23a. Note that the P type impurity is contained in the body region at a relatively low concentration ($P^-$).

A body region of the bottom of the channel region 23a serves as a charge accumulating region 23b, that is, storage node SN shown in FIG. 1.

Further, the impurity-diffused region 22 corresponds to the node PN shown in FIG. 1 and the impurity-diffused region 24 corresponds to a source, electrically connected to the source line SL. The gate electrode 19 is connected electrically to the gate line GL.

Here, the periphery of the memory cell MC is surrounded by element isolation insulating film 15 and the element isolation insulating film 15 is formed from the top face of the silicon layer 13 to reach the top face of the buried oxide film 12. Each memory cell MC is separated electrically from other memory cell MC. This element isolation insulating film 15 is called full isolation insulation film.

Therefore, the body region of the storage transistor STr is isolated electrically from adjoining other memory cell MC by the element isolation insulating film 15 so that it is floated. A charge accumulating region 23b is constituted of a body region in the floating condition.

The storage transistor STr produces the state in which a hole is accumulated in the charge accumulating region 23b (state in which the threshold voltage of the storage transistor STr is low) and the state in which no hole is accumulated (state in which the threshold voltage is high) so as to memorize data "1" and data "0" respectively.

The access transistor ATr has impurity-diffused regions 20, 22 containing the N type impurity at a relatively high concentration ($N^+$), gate oxide film 16 and gate electrode 17.

The impurity-diffused regions 20, 22 are formed from the top face of the silicon layer 13 to reach the top face of the buried oxide film 12 and the gate electrode 17 is disposed on the silicon layer 13 between the both regions through the gate oxide film 16.

The silicon layer 13 between the impurity-diffused regions 22 and 24 is a region called body region and the surface thereof serves as the channel region 21. Note that the body region contains the P type impurity at a relatively low concentration ($P^-$).

The impurity-diffused region 20 is connected electrically to the bit line BL and the gate electrode 17 is connected electrically to the work line WL.

Figure 4:
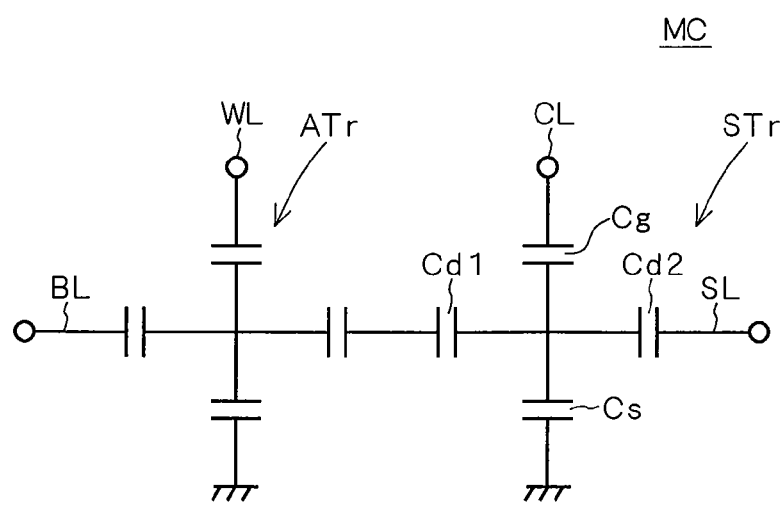
FIG. 4 is an equivalent circuit schematic showing the electrostatic capacity of each portion of the memory cell MC of the TTRAM.

Next, about the memory cell MC described above, the electrostatic capacity of each portion is represented as an equivalent circuit schematic in FIG. 4.

As shown in FIG. 4, in the storage transistor STr, a capacity Cs generated between the body and silicon substrate 11 (FIG. 3), a parasitic capacity Cd1 generated between the body and the impurity-diffused region 22 (FIG. 3) and a parasitic capacity Cd2 generated between the body and the impurity-diffused region 24 (FIG. 3) exist as well as a capacity Cg generated between the gate and body. Note that although the same capacity exists in the access transistor ATr, description thereof is omitted.

In the memory cell MC, accumulation and discharge of the holes in the storage node SN are controlled by raising and lowering the potential of the storage node SN using the coupling (gate coupling) of the capacity Cg of the storage transistor STr.

Although the parasitic capacities Cd1, Cd2 act to disturb the coupling of the capacity Cg, if the capacity Cg is sufficiently larger than the parasitic capacities Cd1, Cd2, influence of the parasitic capacities Cd1, Cd2 is small. The MOS transistor has tended to be miniaturized with miniaturization and intensified integration of the semiconductor memory device in recent years, so that the capacity Cg is inclined to be reduced.

According to an estimation of inventors, a ratio of the parasitic capacity Cd1 (same in Cd2) with respect to the capacity Cg in the MOS transistor of a current generation semiconductor device called 130 nm node drops in a next generation semiconductor device called 65 nm node and it is estimated that its effective gate capacity is reduced.

If the effective gate capacity is reduced, the coupling efficiency drops, so that such a phenomenon that the potential of the storage node SN does not rise up to the power source potential VDD occurs. Consequently, it comes that holes corresponding to writing of data "1" cannot be accumulated in the storage node SN.

To solve this, inventors have reached a technical idea of using GIDL (Gate Induced Drain Leakage) in addition to the gate coupling as a mechanism for supplying holes to the storage node SN.

A. First Embodiment

A-1. About GIDL Current

The GIDL current is a leak current which flows from the drain region to the body region if a high electric field is applied to an end portion of the drain region existing under the gate electrode when the transistor is off. When electrons move from the body region to the drain region and then, holes move from the drain region to the body region, holes can be injected into the body region.

FIG. 5 shows the relation between the gate voltage (gate/source voltage) Vgs(V) and the drain current Id(A). When the source potential is biased so that the gate potential turns to a positive electric potential, so-called main current flows dominantly from the source to the drain. However, when the source potential is biased so that the gate potential turns to a negative electric potential, the GIDL current flows dominantly and as a difference between the source potential and the gate potential is increased, the GIDL current is increased.

To supply the storage node SN of the storage transistor STr (FIG. 1) with holes using this GIDL current, data writing action in the TTRAM needs to be devised.

A-2. Writing Operation

The data writing operation using the GIDL current in the TTRAM will be described using a timing chart shown in FIGS. 6(a) to (e) with reference to FIG. 1.

A-2-1. Data "0" Writing Operation

Figure 6:
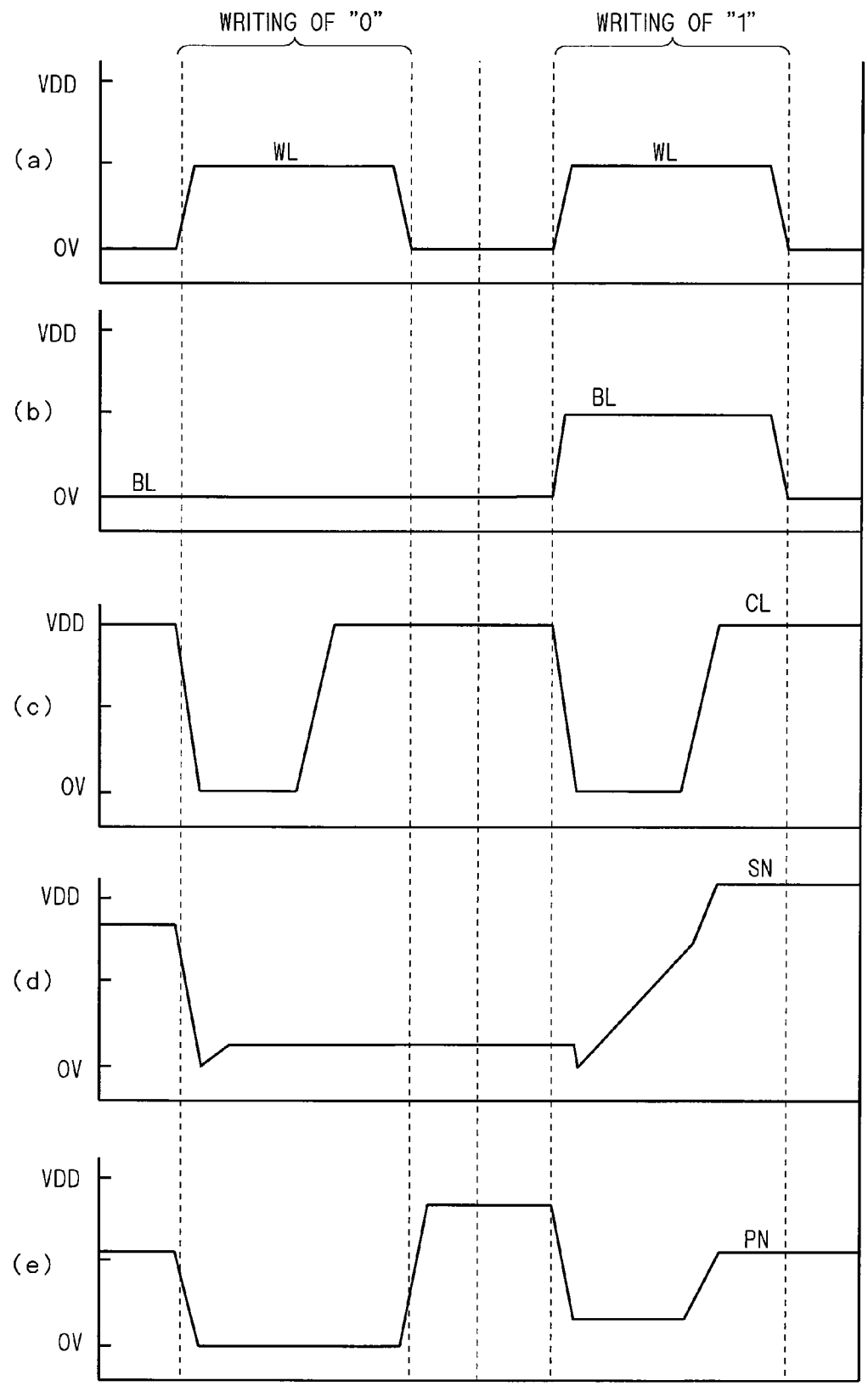
FIG. 6 is a timing chart for explaining a data write operation using GIDL current in the TTRAM of the first embodiment of the present invention.

As shown in FIGS. 6(a) and (b), the bit line BL is set to low potential (0V) and the word line WL is raised from a low potential (0V) to a high potential (½VDD), and then, the charge line CL is lowered from a high potential (VDD) to a low potential (0V). Consequently, the node PN is lowered from a first high potential (near ½VDD) to a low potential (0V) and by gate coupling, the storage node SN is dropped from the first high potential (near VDD) to the low potential (0V). As a result, a state in which no charges are accumulated in the storage node SN (data "0") is produced. The potential of the storage node SN, which is lowered to 0V, is raised slightly due to flow-in of holes by the GIDL. However, because the access transistor is kept ON when data "0" is written, if charges are accumulated more than a specified level, they flow out to the bit line BL through the access transistor, so that the potential of the storage node SN is not raised more than a specific level.

As shown in FIGS. 6(b) and (c), the charge line CL is raised from a low potential to a high potential while the bit line BL is maintained at a low potential. Because the bit line BL is of a low potential at this time and the word line WL is of a high potential as shown in FIG. 6(a), the access transistor ATr is kept ON and the node PN is maintained at a low potential.

If the potential of the charge line CL is raised so that a channel is formed in the storage transistor STr, the gate coupling is blocked by the channel (channel block) and even if the potential of the charge line CL is raised up to a high potential, the potential of the storage node SN is not raised more than a specific level.

That is, holes supplied from the source line SL to the node PN through the storage transistor STr are discharged to the bit line BL through the access transistor ATr. Then, a state in which no holes are accumulated in the storage node SN is maintained and data "0" is written into the storage transistor STr. Note that a period in which the node PN is maintained at a low potential (0V) is called pre-charge period.

After that, by reducing the word line WL from a high potential to a low potential, the access transistor ATr is turned off and as shown in FIG. 6(e), the node PN is raised from a low potential to a second high potential (near VDD).

Because the charge line CL is raised up to the power source voltage VDD and the source line SL is at a power source voltage VDD, ON current of the transistor flows into the node PN, so that the potential of the node PN is raised. However, if the potential of the node PN exceeds a threshold of the storage transistor STr, flow of the ON current is stopped and rise of the potential of the node PN is stopped.

A-2-2. Data "1" Writing Operation

When data "1" is written, the potential of the charge line CL is lowered to a low potential as shown in FIG. 6(b), and at the same time, the word line WL and the bit line BL are raised from a low potential to a high potential (½VDD). Consequently, as shown in FIG. 6(e), the node PN is lowered to a second high potential (near VDD) and as shown in FIG. 6(d), the potential of the storage node SN is dropped by coupling from the charge line CL temporarily and increased gradually. This mechanism is as follows.

That is, when the potentials of the word line WL and bit line BL turn to a high potential simultaneously, the access transistor ATr is turned OFF and the potential of the node PN turns into a floating state.

Because the charge line CL is at a low potential (0V) at this time, a negative potential is biased between the gate and the source of the storage transistor STr. On the other hand, because the potential of the source line SL which is a drain of the storage transistor STr is of a positive electric potential, a high electric field is applied to an end portion of the drain region existing under the gate electrode, so that the GIDL current flows from the drain region to the body region.

Consequently, holes are injected from the drain side to the storage node SN, so that the potential of the storage node SN is increased gradually with accumulation of holes.

Next, the charge line CL is raised from a low potential to a high potential at a timing when the potential of the storage node SN reaches a predetermined potential (near VDD).

Because both the bit line BL and the word line WL are at a high electric potential, the access transistor ATr is kept OFF and the potential of the node PN is in the floating state. In this state, no channel is formed in the storage transistor STr even if the potential of the charge line CL is raised. Consequently, no channel is blocked and the potential of the storage node SN is raised further by the gate coupling with a rise of the potential of the charge line CL and sometimes becomes higher than the power source potential VDD if a rise by charges of holes replenished by the GIDL current is added.

Consequently, holes supplied from the source line SL to the storage node SN are accumulated in the storage node SN without being discharged to the bit line BL, so that the state of data "1" is produced. Further, as shown in FIG. 6(e), the potential of the node PN in the floating state is raised from a low potential to a first high potential interlocked with a rise of the potential of the storage node SN.

A-3. Characteristic Operation and Effect

As described above, the semiconductor memory device of the first embodiment adopts a structure in which when writing data "1", the potentials of the word line WL and bit line BL are increased simultaneously and before increasing the potential of the charge line CL, holes are supplied to the storage node SN by the GIDL current preliminarily. Consequently, holes can be accumulated efficiently as compared with a case of accumulating the holes by increasing the potential of the storage node SN only by gate coupling and a quantity of charges corresponding to writing of data "1" can be obtained securely.

A-4. Configuration of the Device for Setting Potentials to the WORD LINE and Bit Line Simultaneously Next, the configuration of the device for setting the potentials to the word line WL and the bit line BL simultaneously will be described with reference to FIG. 7.

Figure 7:
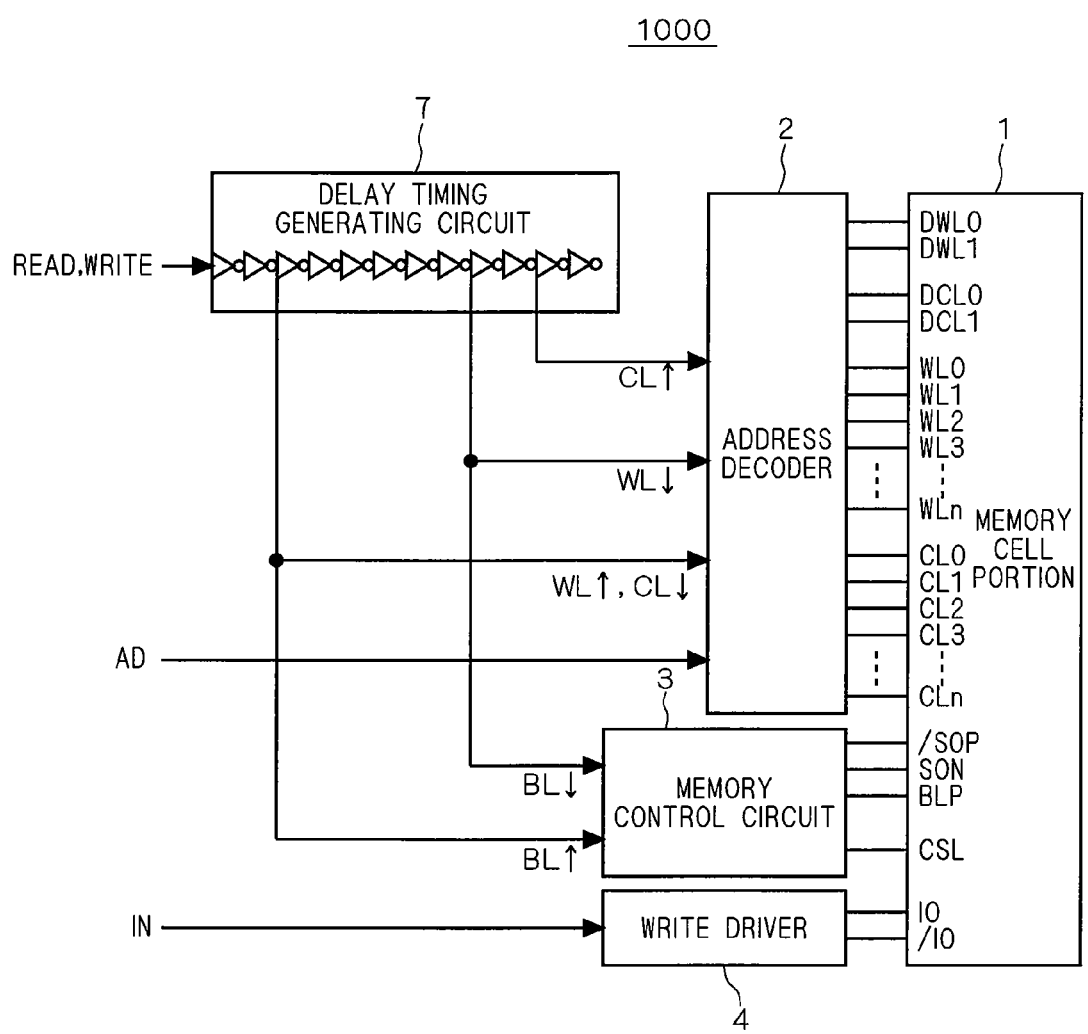
FIG. 7 is a block diagram showing the entire structure of the semiconductor memory device of the present invention.

FIG. 7 is a block diagram showing the entire configuration of the semiconductor memory device 1000 of the present invention. As shown in FIG. 7, the semiconductor memory device 1000 includes a memory array 1, an address decoder 2 for receiving an external address signal AD given from outside to a memory cell portion constituted of a plurality of memory cells so as to select a predetermined memory cell, a memory control circuit 3 for controlling a sense amplifying circuit and the like attached to the memory cell portion, a write driver 4 for receiving an external input data IN given from outside to write data and a delay timing generating circuit 7 for adjusting the timing of a signal given to the word line WL, bit line BL and charge line CL.

FIG. 7 shows only the structure relating to the present invention limitedly, and an actual semiconductor memory device includes more components, but description thereof is omitted.

A delay timing generating circuit 7 is constituted of a plurality of inverters connected in series and so constructed to receive an external command signal such as write instruction signal WRITE, read instruction signal READ and adjust a signal supply timing depending on from which inverter to fetch out a signal.

To activate the potentials of the word line WL and bit line BL simultaneously when writing data "1" for example, signals for activating the word line WL and the bit line BL (indicated with WL↑, BL↑ in the same Figure) are fetched from an output of the same inverter.

Further, the word line WL and the bit line BL are deactivated simultaneously after a predetermined time passes after the activation. Thus, by fetching out signals for deactivating the word line WL and the bit line BL (indicated by WL↓, BL↓ in the same Figure) from an output of an inverter on a stage after the inverter for fetching out signals for activating the word line WL and the bit line BL, the signals can be obtained late by a time proportional to the quantity of inverters. In this case, it should be understood that the quantity of the inverters is set up so that a time in which the word line WL and the bit line BL are activated corresponds with a delay time by the inverter.

When writing data "1", the charge line CL is deactivated at a timing of activating the word line WL and the bit line BL. Thus, a signal for deactivating the charge line CL (indicated by CL↓ in the same Figure) is fetched from an inverter from which a signal for activating the word line WL and the bit line BL was fetched out and after the word line WL and the bit line BL are activated, the charge line CL is activated after a predetermined time elapses. For the reason, a signal for activating the charge line CL (indicated by CL↑ in the same Figure) is fetched from an output of an inverter on a latter stage than the inverter from which the signal for activating the word line WL and the bit line BL was fetched out.

Note that the signal for activating/deactivating the word line WL and the charge line CL is given to the address decoder 2 and the signal for activating/deactivating the bit line BL is given to the memory control circuit 3.

In the first embodiment described above, the TTRAM capable of obtaining the quantity of charges corresponding to writing of data "1" even if the miniaturization of the transistor is accelerated has been described. In second to eighth embodiments described below, the structure of a memory array capable of dynamic control of the voltage and frequency in the TTRAM will be described.

B. Second Embodiment

B-1. Structure of Memory Array

Figure 8:
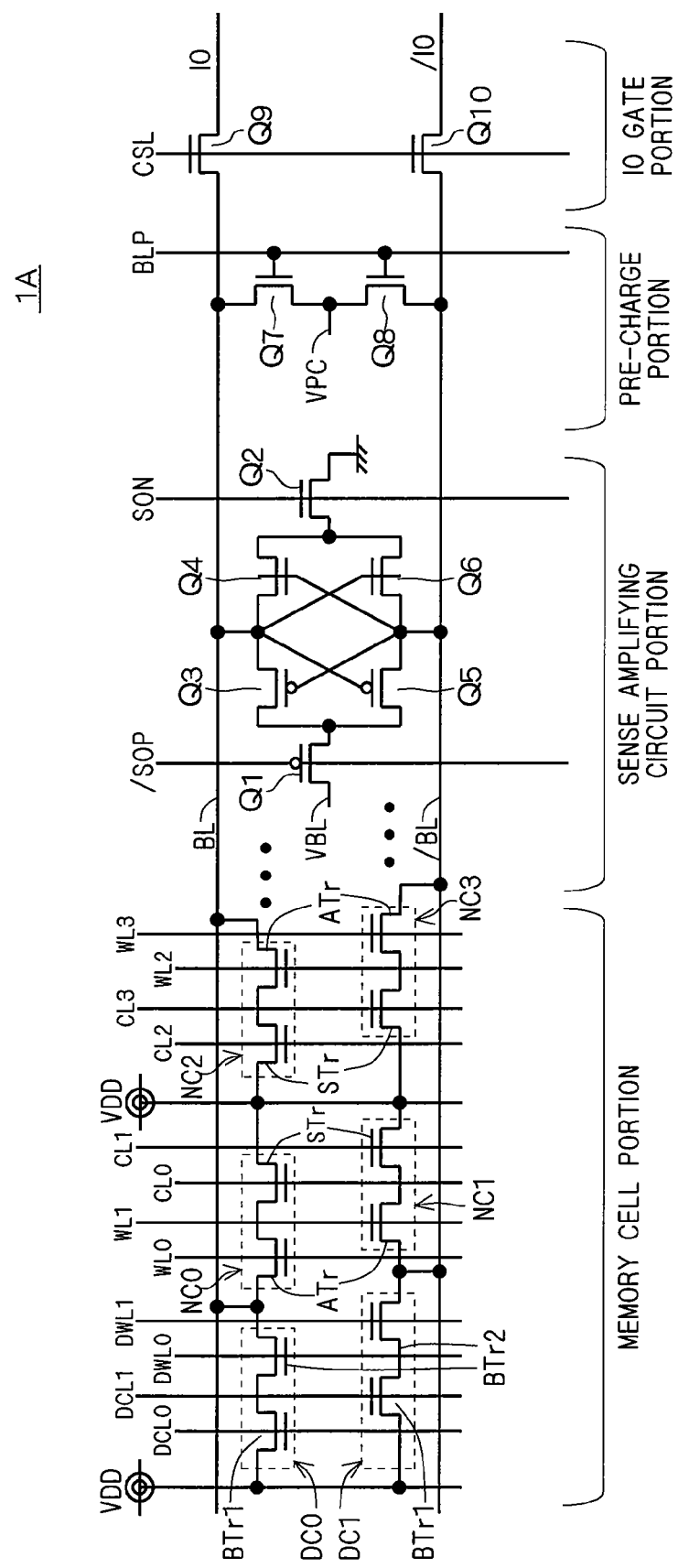
FIG. 8 is a circuit diagram showing the structure of a memory array according to a second embodiment of the present invention.

FIG. 8 shows the structure of the memory array 1A according to the second embodiment. As shown in FIG. 8, the memory array 1A includes a memory cell portion containing a plurality of memory cells of TTRAM type, a sense amplifier circuit portion for amplifying the potential of the bit lines BL and /BL, a pre-charge portion for setting an initial potential of the bit lines BL and /BL and an IO gate portion for inputting/outputting data of the bit lines BL and /BL.

B-1-1. Structure of Memory Cell Portion

The memory cell portion includes a normal cell for use in reading and writing of data and a dummy cell for supplying a reference current at the time of reading.

FIG. 8 shows the structure including a dummy cell DC0 for supplying a reference current to the bit line BL and a dummy cell DC1 for supplying a reference current to a bit line/BL. The dummy cell DC0 is constituted of body fixed transistors BTr1 and BTr2 connected in series between the power source line VDD and the bit line BL and the dummy cell DC1 is constituted of body fixed transistors BTr1, BTr2 connected in series between the power source line VDD and the bit line /BL.

Note that the body fixed transistor is a MOS transistor in which the potential of the body region is fixed to the source potential. The body fixed transistor BTr1 connected to the power source line VDD corresponds to the storage transistor and the body fixed transistor BTr2 connected to the bit line BL (/BL) corresponds to the access transistor.

With such a structure, a current at middle between cases where data of the storage node of the storage transistor is "1" and "0" flows to the dummy cells DC0 and DC1, so that the potential of the storage node can be always fixed to ½ VDD.

A dummy charge line DCL0 and a dummy word line DWL0 are connected to the gates of the body fixed transistors BTr1 and BTr2 of the dummy cell DC0 respectively and a dummy charge line DCL1 and a dummy word line DWL1 are connected to the gates of the body fixed transistors BTr1, BTr2 of the dummy cell DC1 respectively.

Then, the dummy cells DC0, DC1 are controlled to operate complementarily. For example, when an even number word line (WL0, WL2, . . . ) is selected, an odd number dummy cell DC1 is selected and when an odd number word line (WL1, WL3, . . . ) is selected, an even number dummy cell DC0 is selected.

FIG. 8 shows a structure in which normal cells NC0 and NC2 are connected to the bit line BL and normal cells NC1 and NC3 are connected to a bit line /BL. However, these are only a part and it should be understood that more normal cells are connected to the bit lines BL and /BL.

The normal cells NC0 to NC3 have the same structure as the memory cell MC described with reference to FIG. 1, and includes the storage transistor STr connected to the power source line VDD and the access transistor ATr connected to the bit line BL (/BL).

A word line WL0 and charge line CL0 are connected to the gates of the storage transistor STr and the access transistor ATr of a normal cell NC0 respectively. A word line WL1 and charge line CL1 are connected to the gates of the storage transistor STr and the access transistor ATr of a normal cell NC1 respectively. A word line WL2 and charge line CL2 are connected to the gates of the storage transistor STr and access transistor ATr of a normal cell NC2 respectively. A word line WL3 and charge line CL3 are connected to the gates of the storage transistor STr and access transistor ATr of a normal cell NC3 respectively.

B-1-2. Structure of Sense Amplifier Circuit Portion

The sense amplifier circuit is a cross couple circuit in which two inverters are cross-connected. That is, it includes a PMOS transistor Q3 and NMOS transistor Q4 connected in series, which constitute the inverter, and a PMOS transistor Q5 and NMOS transistor Q6 connected in series, which constitute the inverter. A connecting node between the PMOS transistor Q3 and the NMOS transistor Q4 is connected to the bit line BL and the gates of the PMOS transistor Q5 and the NMOS transistor Q6 are connected to the connecting node. A connecting node between the PMOS transistor Q5 and the NMOS transistor Q6 is connected to the bit line /BL and the gates of the PMOS transistor Q3 and the NMOS transistor Q4 are connected to that connecting node.

Then, the NMOS transistors Q4 and Q6 use gate/body directly-connected transistor. With this structure, the transistor can be securely turned ON even at a low gate voltage, so that for example, such a problem that it is not turned ON easily even if an initial pre-charge voltage (VPR) is grounding potential (GND pre-charge) is not generated, thereby preventing any malfunction.

The PMOS transistors Q3, Q5 are connected to the PMOS transistor Q1 commonly so as to provide a bit line drive voltage VBL (½ VDD here) through the PMOS transistor Q1. Note that a sense amplifier activating line/SOP is connected to the gate of the PMOS transistor Q1.

The NMOS transistor Q4 and Q6 are connected to the NMOS transistor Q2 commonly and can be grounded through the NMOS transistor Q2. Note that a sense amplifier activating line S0N is connected to the gate of the NMOS transistor Q2.

B-1-3. Structure of Pre-Charge Portion

The pre-charge portion includes NMOS transistors Q7, Q8 disposed between the bit lines BL and /BL such that they are connected in series.

Then, the pre-charge voltage VPC is given to a connecting node between the NMOS transistors Q7 and Q8 and the gates of the NMOS transistors Q7, Q8 are connected to a pre-charge signal line BLP.

B-1-4. Structure of IO Gate Portion

The IO gate portion is constituted of NMOS transistors Q9, Q10 main electrode of which is connected to the bit lines BL and /BL respectively, and Input/Output lines IO and /IO are connected to the other main electrode of the NMOS transistors Q9, Q10 respectively. A column selecting line CSL is connected to the gates of the NMOS transistors Q9, Q10.

B-2. Operation of Memory Array

Next, the operation of the memory array 1A described above will be described by taking its reading action as an example using a timing chart shown in FIG. 9(a) to (e).

In a period in which the pre-charge signal BLP is activated as shown in FIG. 9(a), the bit lines BL and /BL are initialized to initial pre-charge voltage VPR (0V) as shown in FIG. 9(e).

When the pre-charge signal BLP is deactivated and any memory cell is selected, data reading from the memory cell portion begins and the bit line potential is raised at a speed corresponding to a memory condition (potential state) of the memory cell portion.

When a potential difference between the bit lines BL and /BL becomes sufficiently large (time T1), by activating the sense amplifier activating signals S0N and /S0P as shown in FIG. 9(b), (c), amplification operation of the sense amplifying circuit portion is carried out.

Here, because the potentials of the storage nodes of the storage transistors of the dummy cells DC0, DC1 are always fixed to ½ VDD, the dummy cell selected complementarily to the memory cell always raises the bit line potential at a speed corresponding to the potential state of the ½VDD.

For example, if data "1" is read out form the normal cell NC0, in the bit line BL to which the normal cell NC0 is connected, the potential is raised at a speed corresponding to the potential condition of data "1", that is, potential VDD. In the bit line /BL to which the dummy cell DC1 selected complementarily is connected, the potential is raised at a speed corresponding to the potential condition of ½VDD and an evident potential difference is generated relative to the bit line BL at time T1.

Although in FIG. 9(e), the time T1 is a time when the potential difference is sufficiently large, the potential of the bit line /BT turns to a decrease across this time and the potential of the bit line BL is increased further.

When data "0" is read out from the normal cell NC0, the operation is inverted, so that in the bit line BL to which the normal cell NC0 is connected, the potential is raised at a speed corresponding to the potential condition of data "0", that is, 0V and in the bit line /BL to which the dummy cell DC1 selected complementarily is connected, the potential is raised at a speed corresponding to the potential condition of ½ VDD and as for the potential at time T1, that of the bit line BL is higher. Then, the potential of the bit line BL turns to a decrease across this, while the potential of the bit line /BL is increased further.

After a time T2 when the potential difference of the bit lines BL and /BL is increased further, the column selecting line CSL is activated in a specified period and data is read out to the Input/Output lines IO and /IO and transmitted, as shown in FIG. 9(d).

B-3. Characteristic Operation and Effect

As described above, the semiconductor memory device of the second embodiment has a following structure. The dummy cells DC0, DC1 are connected to the bit lines BL and /BL respectively. If any one of the plural normal cells connected to the bit line BL is selected, the dummy cell DC1 is selected complementarily. If any one of the plural normal cells connected to the bit line /BL is selected, the dummy cell DC0 is selected complementarily. Consequently, a potential difference between the bit lines BL and /BL can be obtained evidently, whereby preventing a malfunction from being generated in the sensing operation of the sense amplifying circuit portion.

In the sense amplifying circuit portion, of the MOS transistors of the inverter constituting the cross couple circuit, a gate/body directly-connected transistor is used as the NMOS transistor. As a result, the NMOS transistor can be turned ON securely at even a low gate voltage, and if total consumption power is reduced by operating in the TTRAM memory cell, which is a capacitorless memory, by lowering the power source voltage when no high speed operation is required, stabilized operation can be guaranteed even if the quantity of accumulated charges is reduced.

B-4. Example of Structure of Gate/Body Directly-Connected Transistor

An example of the structure of the gate/body directly-connected transistor will be described using FIG. 10 and FIG. 11.

Figure 10:
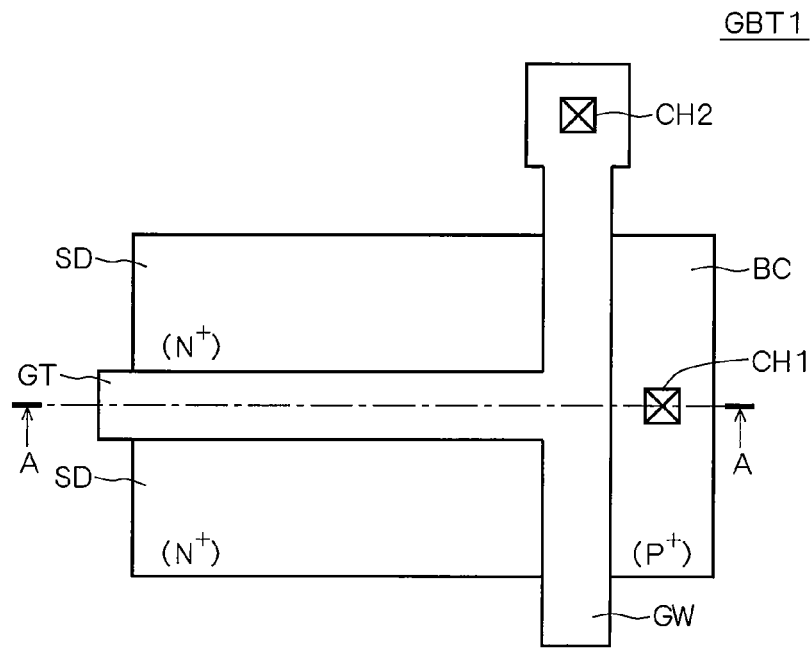
FIG. 10 is a plan view showing an example of the structure of a gate/body directly-connected transistor.

FIG. 10 is a diagram showing a plan layout of the gate/body directly-connected transistor GBT1. A gate electrode GT and a gate wiring GW are disposed such that it is in T shape with respect to the gate electrode GT.

N type impurity relatively high concentration (N+) source-drain region SD is provided outward of both side faces in the gate length direction of the gate electrode GT and a body contact region BC containing P type impurity at a relatively high concentration (P+) is provided outward (opposite side to a side in which the source-drain region SD is provided) of the side face in the line width direction of the gate wiring GW.

Figure 11:
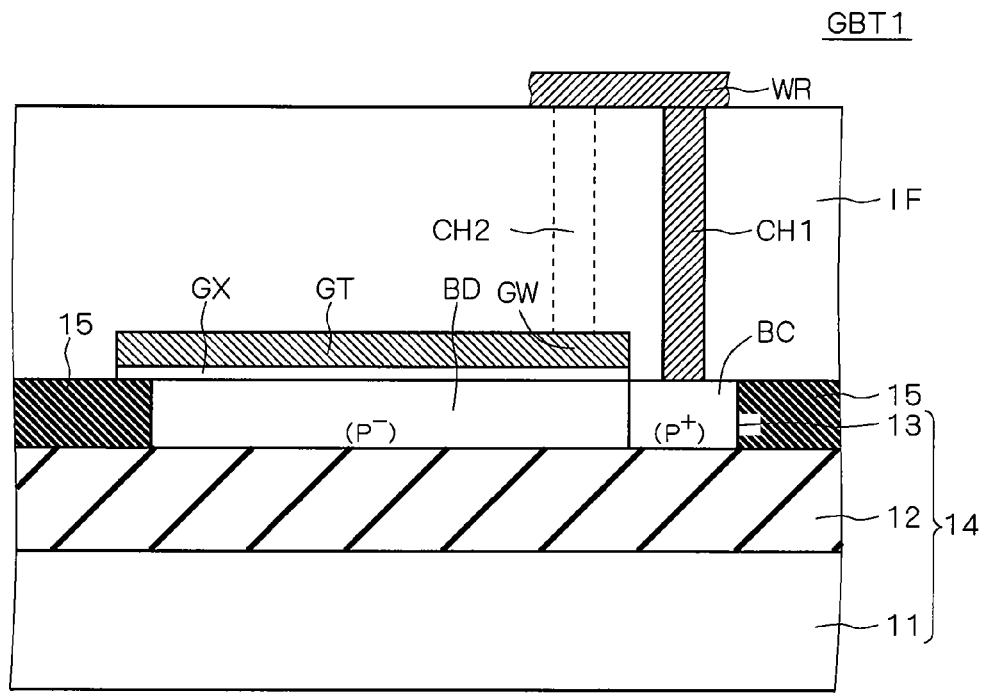
FIG. 11 is a sectional view showing an example of the structure of the gate/body directly-connected transistor.

FIG. 11 is a sectional diagram showing the structure of a section in an arrow direction taken along the line A-A shown in FIG. 10. As shown in FIG. 11, a gate/body directly-connected transistor GBT1 is disposed on the SOI substrate 14 in which the silicon substrate 11, the buried oxide film 12 and the silicon layer 13 (SOI layer) are overlaid in this order and a gate electrode GT is disposed on body region BD containing the P type impurity at a relatively low concentration (P−) through gate oxide film GX.

The body region BD and the body contact region BC are formed such that they are buried from the top face of the silicon layer 13, reaching the top face of the oxide film 12, and the body contact region BC is in contact with the side face of the body region BD.

Therefore, the body region BD and the body contact region BC are connected electrically and if the body contact region BC is connected to the gate electrode GT electrically, the potential of the body region BD can be equalized with the potential of the gate electrode GT.

By connecting a contact portion CH1 provided such that it penetrates interlayer insulation film IF covering the gate/body directly-connected transistor GBT1 and reaches the body contact region BC and a contact portion CH2 provided such that it penetrates interlayer insulation film IF and reaches the gate wiring GW through wiring layer WR disposed on the interlayer insulation film IF, the potential of the body region BD is equalized with the potential of the gate electrode GT.

The periphery of the gate/body directly-connected transistor GBT1 is surrounded by a element isolation insulating film 15 and the element isolation insulating film 15 is formed such that it is buried from the top face of the silicon layer 13 and reaches the top face of the oxide film 12 while isolated electrically from other MOS transistors. Note that the element isolation insulating film 15 is provided under the gate wiring GW between the body contact region BC and the source-drain region SD and the body contact region BD and the source-drain region SD are isolated electrically.

Figure 12:
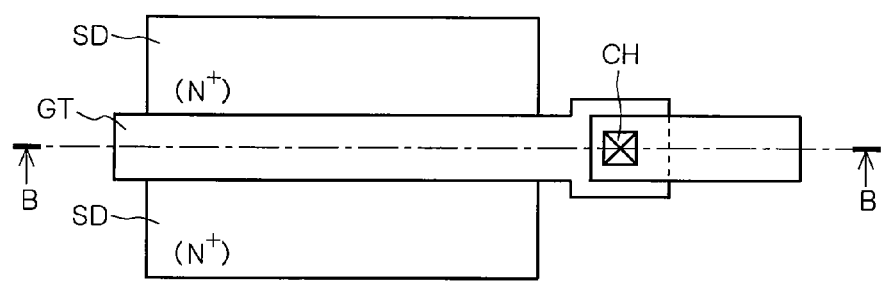
FIG. 12 is a plan view showing other example of the structure of the gate/body directly-connected transistor.
Figure 13:
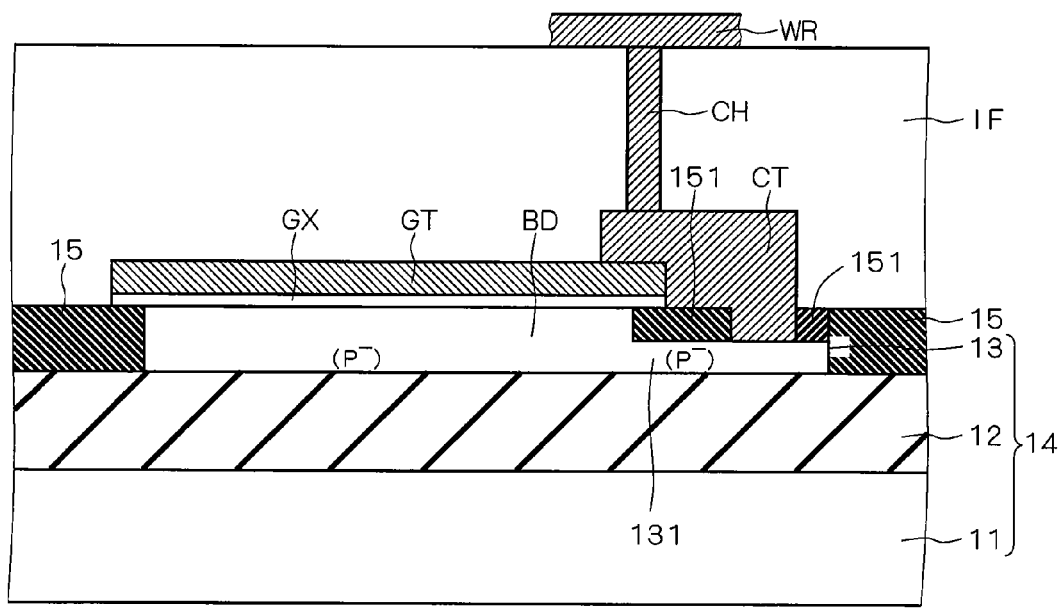
FIG. 13 is a sectional view showing other example of the structure of the gate/body directly-connected transistor.

As the structure of the gate/body directly-connected transistor, a structure shown in FIG. 12 and FIG. 13 can be considered.

FIG. 12 is a diagram showing a plan layout of the gate/body directly-connected transistor GBT2 and a contact layer CT extending outward from above an end portion on one side in the gate width direction of the gate electrode GT is disposed.

N type impurity relatively high concentration (N+) source-drain region SD is provided outside of both side faces in the gate length direction of the gate electrode GT.

FIG. 13 is a sectional view showing the structure of a section in the arrow direction taken along the line B-B shown in FIG. 1. As shown in FIG. 13, the gate/body directly-connected transistor GBT is disposed on the SOI substrate 14 and the gate electrode GT is disposed on the body region BD containing P type impurity at a relatively low concentration (P−) through the gate oxide film GX.

A partial element isolation insulating film 151 is disposed in the surface of a SOI layer 13 outside of an end portion on one side in the gate width direction of the gate electrode GT.

In the partial element isolation insulating film 15, a trench is formed in the surface of the SOI layer 13 so that the SOI layer 13 of a predetermined thickness is remained between its bottom portion and the buried oxide film 12 and an insulation substance is buried in that trench. A well region 131 containing the P type impurity at a relatively low concentration (P−) exists under the partial element isolation insulating film 151.

The contact layer CT extending from above the gate electrode GT up to on the partial element isolation insulating film 151 is charged in an opening portion OP which penetrates the partial element isolation insulating film 151, such that it is in contact with the well region 131.

Therefore, the potential of the body region BD becomes equal to the potential of the gate electrode GT through the well region 131 and the contact layer CT.

By providing the contact portion CH which penetrates an interlayer insulation film IF covering the gate/body directly-connected transistor GBT2 and reaches the contact layer CT and then connecting the contact portion CH with the wiring layer WR disposed on the interlayer insulation film IF, the gate electrode GT can be supplied with a predetermined potential (gate signal).

Here, the periphery of the gate/body directly-connected transistor BGT2 is surrounded by the element isolation insulating film 15 except a region in which the partial element isolation insulating film 151 is disposed and separated electrically from other MOS transistors.

The body fixed transistors BTr1, BTr2 which constitute the dummy cells DC0, DC1 shown in FIG. 8 may adopt a structure in which the body region is connected electrically with a desired portion through the body contact region like the gate/body directly-connected transistor GBT1 shown in FIGS. 10, 11 or may adopt a structure in which the body region is connected electrically with a desired region through the well region under the partial element isolation insulating film like the gate/body directly-connected transistor GBT2 shown in FIGS. 12, 13. In case of the body fixed transistors BTr1, BTr2, not the gate but the source is the desired portion.

C. Third Embodiment

C-1. Structure of Memory Array

Figure 14:
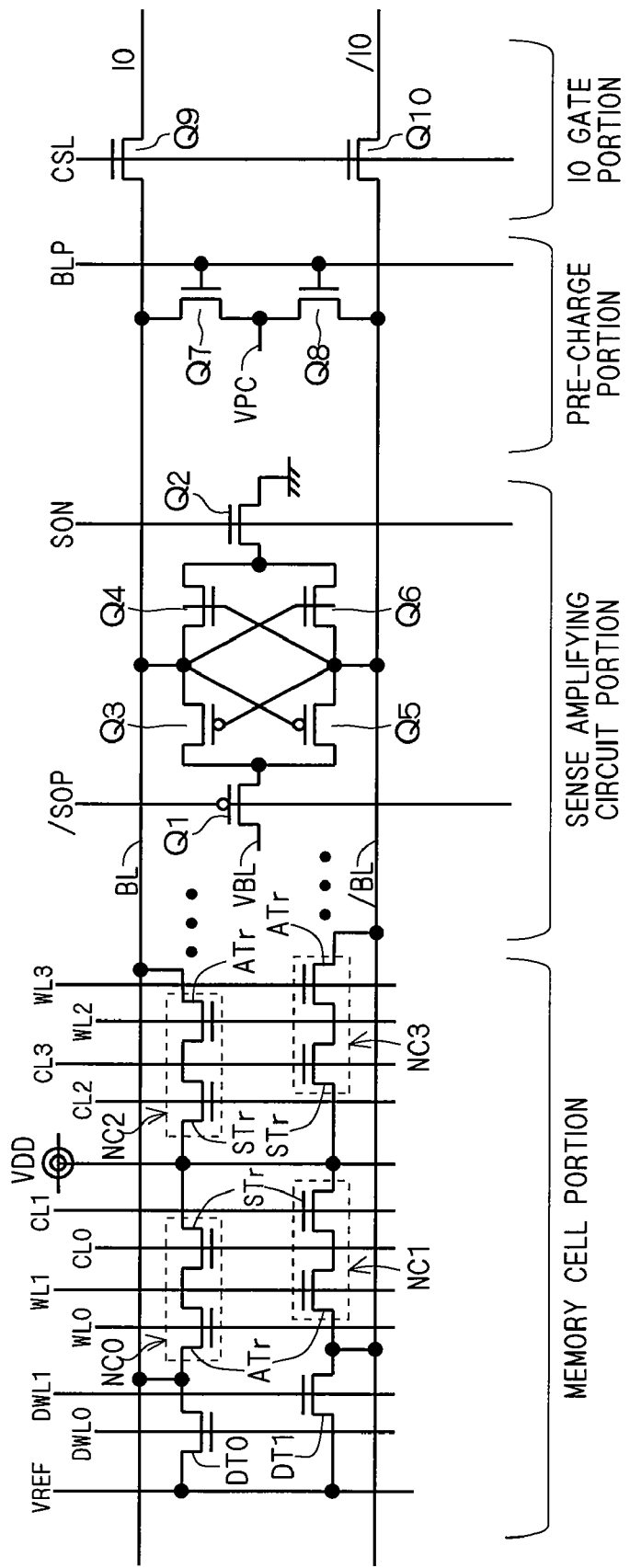
FIG. 14 is a circuit diagram showing the structure of a memory array according to a third embodiment of the present invention.

FIG. 14 shows the structure of a memory array 1B according to the third embodiment. The memory array 1B shown in FIG. 14 is the same as the memory array 1A explained with reference to FIG. 8 except its memory portion, and like reference numerals are attached to the same components as the memory array 1A and duplicated description thereof is omitted.

The memory cell portion includes a normal cell for use in reading and writing of data and a dummy transistor for supplying a reference current for reading.

FIG. 14 shows a structure including a dummy transistor DT0 for supplying a reference current to the bit line BL and a dummy transistor DT1 for supplying a reference current to the bit line /BL, instead of the dummy cells DC0, DC1 of the memory array 1A shown in FIG. 8.

In a dummy transistor DT0, its source is connected to a reference voltage line VREF, and its drain is connected to a bit line BL while a dummy word line DWL0 is connected to its gate. In a dummy transistor DT1, its source is connected to the reference voltage line VREF, its drain is connected to a bit line /BL and a dummy word line DWL1 is connected to its gate.

The voltage of the reference voltage line VREF is set to a voltage between bit line voltages when data "0" is read and when data "1" is read out in order to activate the sense amplifying signal S0N and that voltage is supplied from a dedicated power source circuit.

With such a structure, the quantity of the MOS transistors necessary for supplying a reference current can be reduced to half a case where the dummy cell is used, thereby the area efficiency of the memory cell in the memory array being raised.

C-2. Operation of Memory Array

Next, the operation of the memory array 1B described above will be described by taking its reading action as an example using a timing chart shown in FIG. 15(a) to (e).

In a period in which the pre-charge signal BLP is activated as shown in FIG. 15(a), the bit lines BL and /BL are initialized to initial pre-charge voltage VPR (0V) as shown in FIG. 15(e).

When the pre-charge signal BLP is deactivated and any memory cell is selected, data reading from the memory cell portion begins and the bit line potential is raised at a speed corresponding to a memory condition (potential state) of the memory cell portion.

When a potential difference between the bit lines BL and /BL becomes sufficiently large (time T1), by activating the sense amplifier activating signals S0N and /S0P as shown in FIG. 15(b), (c), amplification operation of the sense amplifying circuit portion is carried out.

Because the sources of the dummy transistors DT0 and DT1 are connected to the reference voltage line VREF, the dummy transistor selected complementarily to the memory cell, upon being tuned ON, raises the potential of the bit line up to a substantially equal potential to the potential of the reference voltage line VREF.

For example, if data "1" is read out form the normal cell NC0, in the bit line BL to which the normal cell NC0 is connected, the potential is raised at a speed corresponding to the potential condition of data "1", that is, potential VDD. In the bit line /BL to which the dummy transistor DT1 selected complementarily is connected, the potential is raised rapidly up to a substantially equal potential to the potential of the reference voltage line VREF, so that an evident potential difference is generated relative to the bit line BL at time T1.

Although in FIG. 15(e), the time T1 is a time when the potential difference is sufficiently large, the potential of the bit line /BT turns to a decrease across this time and the potential of the bit line BL is increased further.

When data "0" is read out from the normal cell NC0, the operation is inverted, so that in the bit line BL to which the normal cell NC0 is connected, the potential is raised at a speed corresponding to the potential condition of data "0", that is, 0V and in the bit line /BL to which the dummy cell DT1 selected complementarily is connected, the potential is raised rapidly up to a substantially equal potential to the potential of the reference voltage line VREF. In this case, as for the potential at time T1, that of the bit line /BL is higher. Then, the potential of the bit line BL turns to a decrease across this, while the potential of the bit line /BL is increased further.

After a time T2 when the potential difference of the bit lines BL and /BL is increased further, the column selecting line CSL is activated in a specified period and data is read out to the Input/Output lines IO and /IO and transmitted, as shown in FIG. 15(d).

C-3. Characteristic Operation and Effect

As described above, the semiconductor memory device of the third embodiment has a following structure. The dummy transistors DT0 and DT1 are connected to the bit lines BL and /BL respectively. If any one of the plural normal cells connected to the bit line BL is selected, the dummy cell transistor DT1 is selected complementarily. If any one of the plural normal cells connected to the bit line /BL is selected, the dummy transistor DT0 is selected complementarily. Consequently, a potential difference between the bit lines BL and /BL can be obtained evidently, whereby preventing a malfunction from being generated in the sensing operation of the sense amplifying circuit portion.

By using the dummy transistor for supplying the reference current, the quantity of the MOS transistors necessary for supplying the reference current can be reduced to half a case where the dummy cell is used, thereby the area efficiency of the memory cell in the memory array being raised.

D. Fourth Embodiment

D-1. Structure of Memory Array

Figure 16:
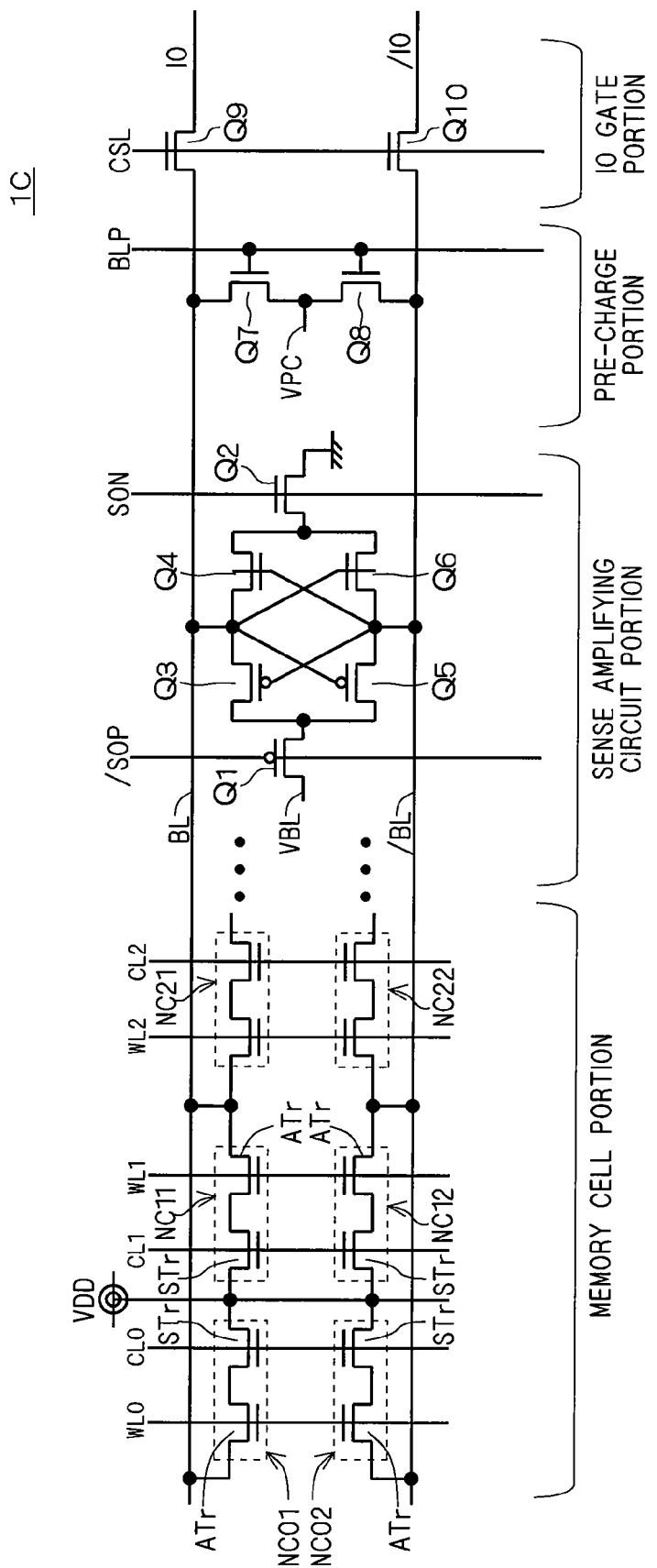
FIG. 16 is a circuit diagram showing the structure of a memory array according to a fourth embodiment of the present invention.

FIG. 16 shows the structure of the memory array 1C of the fourth embodiment. As shown in FIG. 16, in the memory array 1C, its memory cell portion is constructed to correspond to a 1-bit 2-cell type which stores 1-bit information with two memory cells and different from the memory array 1A having the memory cell portion corresponding to the 1-bit 1-cell type described using FIG. 8 in this point. Note that the other parts of the structure are equal to the memory array 1A described with reference to FIG. 8. Like reference numerals are attached to the same components as the memory array 1A and duplicated description thereof is omitted.

In the memory cell portion shown in FIG. 16, the normal cells are connected as a pair to the bit lines BL and /BL by sharing the word line and charge line.

That is, in the normal cell NC01 connected between the power source line VDD and the bit line BL and the normal cell NC02 connected between the power source VDD and the bit line /BL, each access transistor ATr is connected to the word line WL0 and each storage transistor STr is connected to the charge line CL0.

Likewise, in the normal cell NC11 connected between the power source line VDD and the bit line BL and the normal cell NC12 connected between the power source VDD and the bit line /BL, each access transistor ATr is connected to the word line WL1 and each storage transistor STr is connected to the charge line CL1.

In the normal cell NC21 connected between the power source line VDD and the bit line BL and the normal cell NC22 connected between the power source VDD and the bit line /BL, each access transistor ATr is connected to the word line WL2 and each storage transistor STr is connected to the charge line CL2.

When the pairing memory cells are controlled to operate simultaneously, for example, the word line WL0 is selected, a potential corresponding to charges held by the each storage transistor STr is given to the bit lines BL and /BL from the normal cells NC01, NC02.

When data is written, opposite data (complementary data) are provided to the pairing memory cells, so that an evident potential difference is generated between the bit lines BL and /BL.

FIG. 16 shows a structure in which the normal cells NC01, NC11 and NC21 are connected to the bit line BL while the normal cells NC02, NC12 and NC22 are connected to the bit line /BL. However, these are only part of them and it should be understood that more normal cells are connected to the bit lines BL and /BL.

D-2. Operation of Memory Array

Next, the operation of the memory array 1C described above will be described by taking its reading action as an example using a timing chart shown in FIG. 17(a) to (e).

Figure 17:
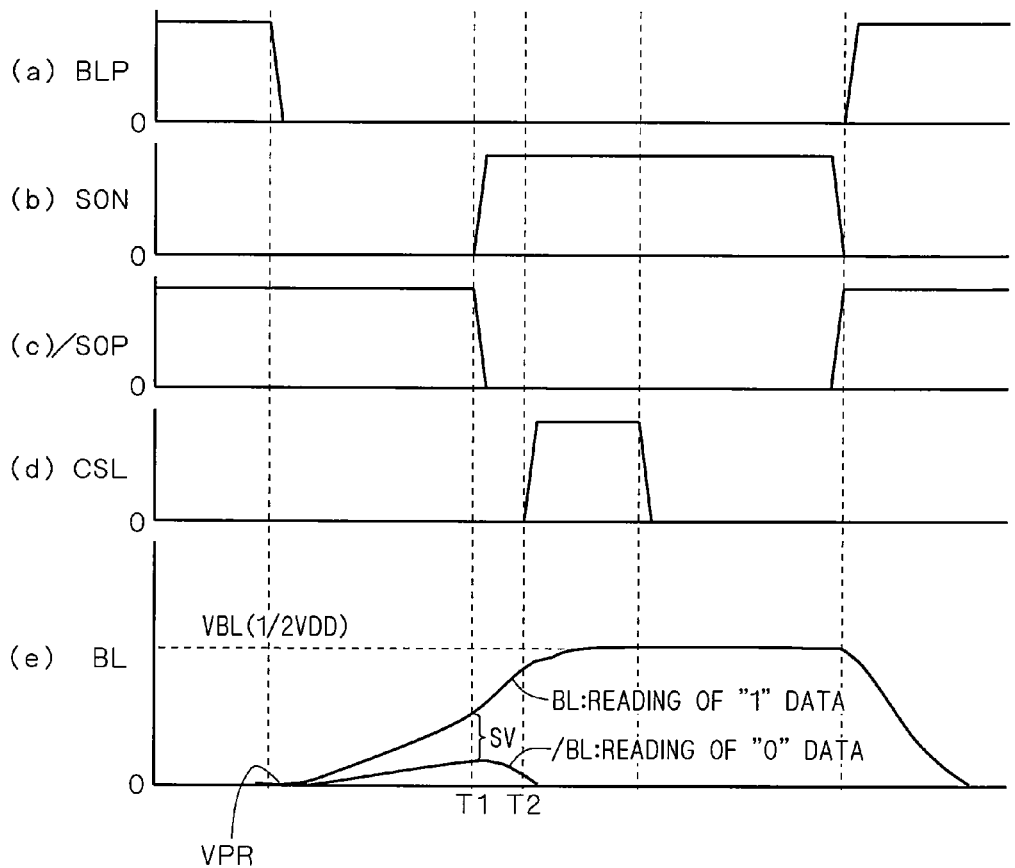
FIG. 17 is a timing chart for explaining a reading operation of data from the fourth embodiment of the present invention.

In a period in which the pre-charge signal BLP is activated as shown in FIG. 17(a), the bit lines BL and /BL are initialized to initial pre-charge voltage VPR (0V) as shown in FIG. 17(e).

When the pre-charge signal BLP is deactivated and any memory cell pair is selected, data reading from the memory cell portion begins and the bit line potential is raised at a speed corresponding to a memory condition (potential state) of the memory cell portion.

When a potential difference between the bit lines BL and /BL becomes sufficiently large (time T1), by activating the sense amplifier activating signals S0N and /S0P as shown in FIG. 17(b), (c), amplification operation of the sense amplifying circuit portion is carried out.

For example, when data "1" is read out from the normal cell NC01, in the bit line BL to which the normal cell NC01 is connected, its potential is raised at a speed corresponding to the potential condition of data "1", that is, the potential VDD. In the bit line /BL to which the normal cell NC02 selected at the same time is connected, the potential is raised at a speed corresponding to the potential condition of data "0", that is, 0V. Thus, at time T1, a potential difference SV corresponding to a potential condition when data "1" is read out and a potential condition when data "0" is read out occurs. Its magnitude is about near double a potential difference of the bit lines between the memory array 1A described using FIG. 8 and the memory array 1B described using FIG. 15.

Although in FIG. 17(e), the time T1 is a time when the potential difference is sufficiently large, the potential of the bit line /BT turns to a decrease across this time while the potential of the bit line BL is increased further.

When data "0" is read out from the normal cell NC1, the operation is inverted, so that in the bit line BL to which the normal cell NC1 is connected, the potential is raised at a speed corresponding to the potential condition of data "0", that is, 0V and in the bit line /BL to which the normal cell NC02 selected at the same time is connected, the potential is raised at a speed corresponding to the potential condition of data "1", that is, the potential VDD. In this case, as for the potential at time T1, that of the bit line /BL is higher. Then, the potential of the bit line BL turns to a decrease across this, while the potential of the bit line /BL is increased further.

After the time T2 when the potential difference between the bit lines BL and /BL is increased further, as shown in FIG. 15(d), the column selecting line CSL is activated in a specific period, so that data is read out to the I/O line IO and /IO and transmitted.

D-3. Characteristic Operation and Effect

As described above, in the semiconductor memory device of the fourth embodiment, the memory cell portion of the memory array 1C is of the 1-bit 2-cell type and the pairing memory cells are supplied with complementary data at the time of data writing and when data is read out, it is controlled so that data is read out from the pairing memory cells simultaneously. Consequently, a potential difference corresponding to a potential condition when data "1" is read out and a potential condition when data "0" is read out is generated, whereby the potential difference between the bit lines being about double a case where it is constituted of the 1-bit 1-cell type.

Thus, the potential difference between the bit lines BL and /BL becomes more evident thereby preventing any malfunction from being generated in the sensing operation of the sense amplifying circuit.

Because the quantity of reading signals is large, high speed sensing operation is enabled so as to enable high speed access. Conversely even when the power source voltage VDD is lowered to half, the sensing operation is enabled. Thus, such a dynamic control which enables the high speed access by raising the voltage when the high speed operation is needed or for a block requiring the high speed operation and conversely which operates at a lower frequency by lowering the voltage when no high speed operation is needed or for a block requiring no high speed operation can be applied to the memory.

Adopting the 1-bit 2-cell type makes it possible to extend a period of time until refresh action is required. This characteristic will be described with reference to FIG. 18 and FIG. 19.

Figure 18:
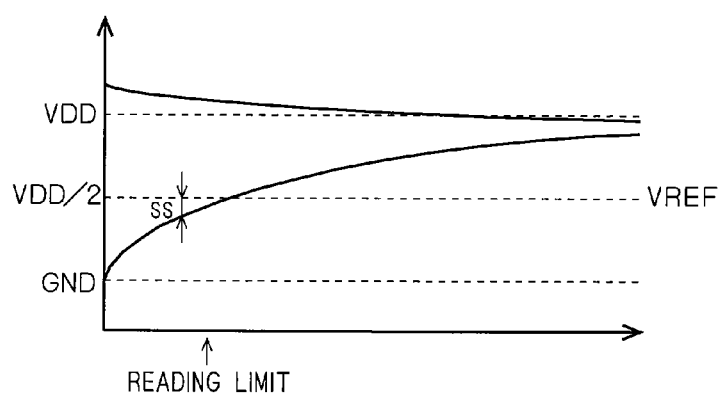
FIG. 18 is a diagram showing changes in held data in a 1-bit 1-cell type TTRAM.

FIG. 18 and FIG. 19 show changes of held data with a time passage in case of data "H" and data "L" by placing time on the abscissa axis and a voltage value corresponding to the quantity of charge of the held data in the TTRAM memory cell on its ordinate axis. Note that FIG. 18 indicates changes with a time passage in case of the 1-bit 1-cell type and FIG. 19 indicates changes with a time passage in case of the 1-bit 2-cell type.

As shown in FIG. 18, in case of the 1-bit 1-cell type, a reference potential VREF (½VDD in this case) is needed and if a difference between the quantity of potential on low potential side data (data "L") and the reference potential VREF is smaller than the sensitivity SS of the sense amplifier, data reading is disabled. Time until this is reached is reading limit.

Then, the storage transistor which constitutes the TTRAM memory cell (in case where the NMOS transistor is constituted) specifies data of "1" or "0" with the quantity of charges of holes accumulated in the storage node. A case of data "0" indicates a state in which no charge is accumulated in the storage node. However, because holes flow in from the source line SL through p-n junction with a time passage, the holes need to be discharged periodically and this is refresh action.

In case of data "1", charges are accumulated such that the potential of the storage node is slightly higher than the VDD as described with reference to FIG. 6(d) and further, because the quantity of charges of holes discharged with a time passage is slight, reduction of the quantity of charges is small.

The time period until this refresh action is required corresponds to reading limit time and in case of the 1-bit 1-cell type, it is specified by the reference potential VREF and the degree of increase of the quantity of charges of low potential side data as described above.

Then, because as shown in FIG. 18, charges of the low potential side data is increased quickly, in case of the 1-bit 1-cell type, the time period until the refresh action is required is short.

On the other hand, as shown in FIG. 19, in case of the 1-bit 2-cell type, the reference potential VREF is not necessary and the reading limit is specified by a time when a potential difference between the low potential side data (data "L") and high potential side data (data "H") becomes smaller than the sensitivity SS of the sense amplifier. Thus, the time period until the refresh action becomes necessary is extended.

If the time period until the refresh action becomes necessary is extended in this way, data holding current can be reduced, so as to reduce a standby current. Further, because the quantity of the reading signal is large, the standby current can be reduced further by holding data with a lower power source voltage.

Because two memory cells hold a single data, even if one of the memory cells is in trouble so that no data can be obtained, the data can be restored if data held by the other memory cell becomes evident, because the data held by the memory cell on one side is opposite to the data held by the other side. As a result, an opportunity in which data is completely lost never occurs, whereby providing a memory having redundancy.

E. Fifth Embodiment

E-1. Structure of Memory Array

Figure 20:
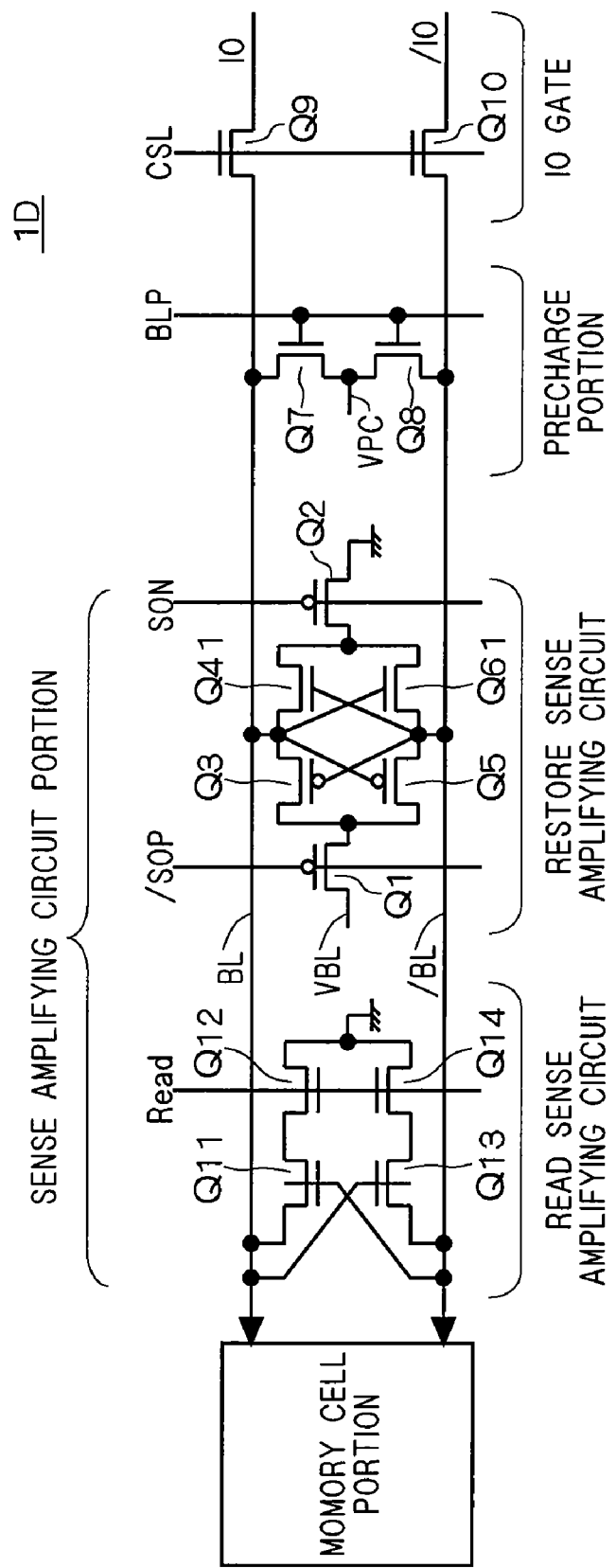
FIG. 20 is a circuit diagram showing the structure of a memory array according to a fifth embodiment of the present invention.

FIG. 20 shows the structure of the memory array 1D according to the fifth embodiment. The memory array 1D shown in FIG. 20 has a feature in the sense amplifying circuit portion and as the structure of the memory cell portion, the same 1-bit 1-cell type as the memory array 1A described with reference to FIG. 8 may be adopted and the same 1-bit 2-cell type as the memory array 1C described with reference to FIG. 16 may be adopted. Thus, representation thereof is omitted. The other parts of the structure are the same as the memory array 1A described with reference to FIG. 8 and like reference numerals are attached to the same components as the memory array 1A and duplicated description thereof is omitted.

As shown in FIG. 20, the sense amplifying circuit portion of the memory array 1D is constituted of a restore sense amplifying circuit and a read sense amplifying circuit.

The read sense amplifying circuit includes NMOS transistor Q11 and NMOS transistor Q12, connected in series between the bit line BL and the ground and NMOS transistor Q13 and NMOS transistor Q14, connected in series between the bit line /BL and the ground. The gates of the NMOS transistor Q11 and the NMOS transistor Q13 are connected to the bit lines /BL and BL. A read activation line Read (which gives read activation signal Read) is connected to the gates of the NMOS transistor Q12 and the NMOS transistor Q14.

As the NMOS transistors Q11 and Q13, the gate/body directly-connected transistor is used.

With such a structure, when data is read out, a read activation signal is given from the read activation line READ in a minimum period in which the bit line potential is low and amplification with the gate/body directly-connected transistor is required, that is, only in a period until the potential difference between the bit lines BL becomes constant after the sense activation signals S0N and /S0N are activated, so as to drive the read sense amplifying circuit. By carrying out sensing with the gate/body directly-connected transistor which is turned ON securely even at a low gate voltage, such a problem that it is not turned ON easily is not generated even if the initial pre-charge voltage (VPR) is grounding potential (GND pre-charge), thereby preventing any malfunction.

After the potential difference between the bit lines BL becomes constant, amplification operation by the restore sense amplifying circuit is carried out by stopping the read activation signal.

Although the gate/body directly-connected transistor is turned ON securely even at a low gate voltage, a large amount of reactive current such as leak current flows for the reason, and it is not desirable to use it for long hours. However, by adopting the above-described structure, a time in which the gate/body directly-connected transistor is kept ON is limited, so that a current flowing to the sense amplifying circuit portion is limited to a minimum level, so as to improve power efficiency.

Note that the read activation signal Read can be produced by AND processing with for example, sense amplifier activation signal S0N, based on an instruction signal READ (FIG. 7) given from outside.

Figure 9:
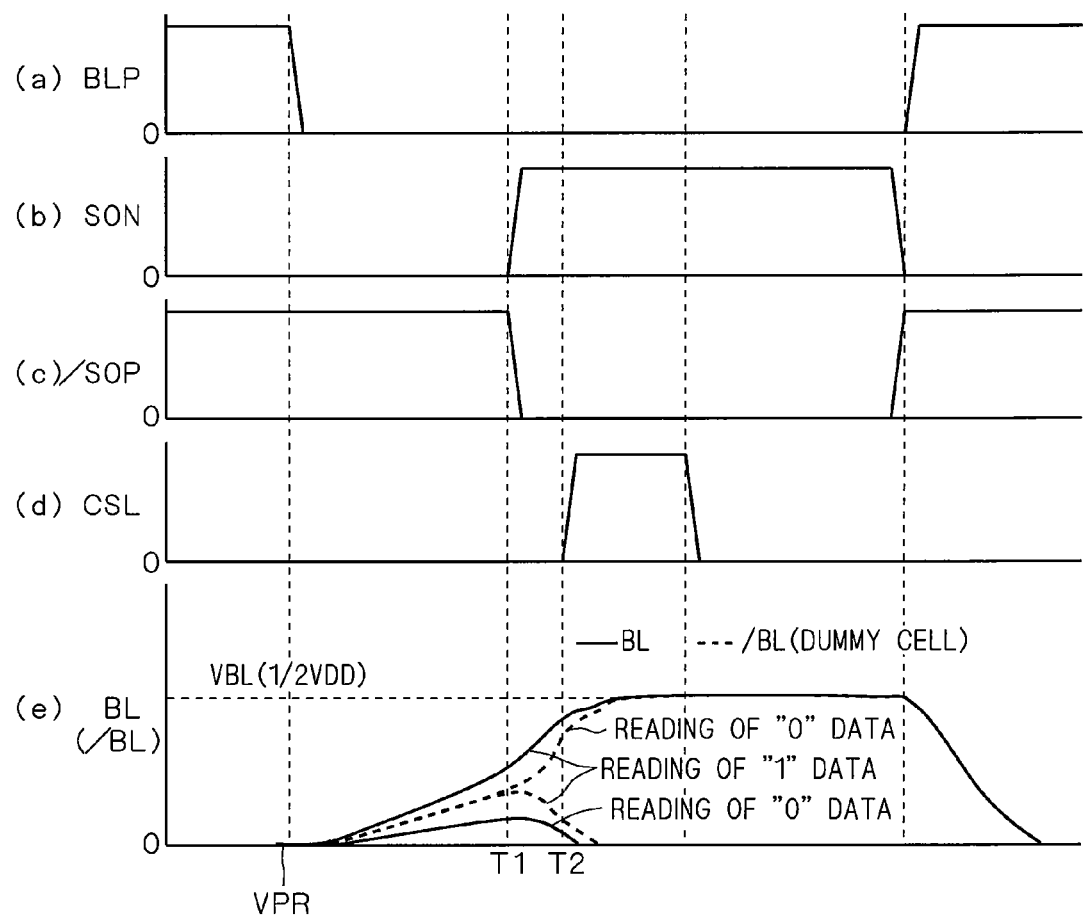
FIG. 9 is a timing chart for explaining a reading operation of data from the memory array according to the second embodiment of the present invention.

The restore sense amplifying circuit has substantially the same structure as the sense amplifying circuit of the memory array 1A shown in FIG. 9. It is constituted of ordinary NMOS transistors Q41 and Q61 instead of the NMOS transistors Q4 and Q6 which are gate/body directly-connected transistors.

Note that the restore sense amplifying circuit is used for refresh action of the memory cell and rewriting of data.

E-2. Characteristic Operation and Effect

As described above, in the semiconductor memory device of the fifth embodiment, the sense amplifying circuit portion is constituted of a restore sense amplifying circuit and a read sense amplifying circuit. When data is read out, sensing is carried out using the read sense amplifying circuit only in a minimum period in which amplification by the gate/body directly-connected transistor is required. As a result, current flowing to the sense amplifying circuit portion is limited to a minimum level so as to improve power efficiency.

F. Sixth Embodiment

Figure 21:
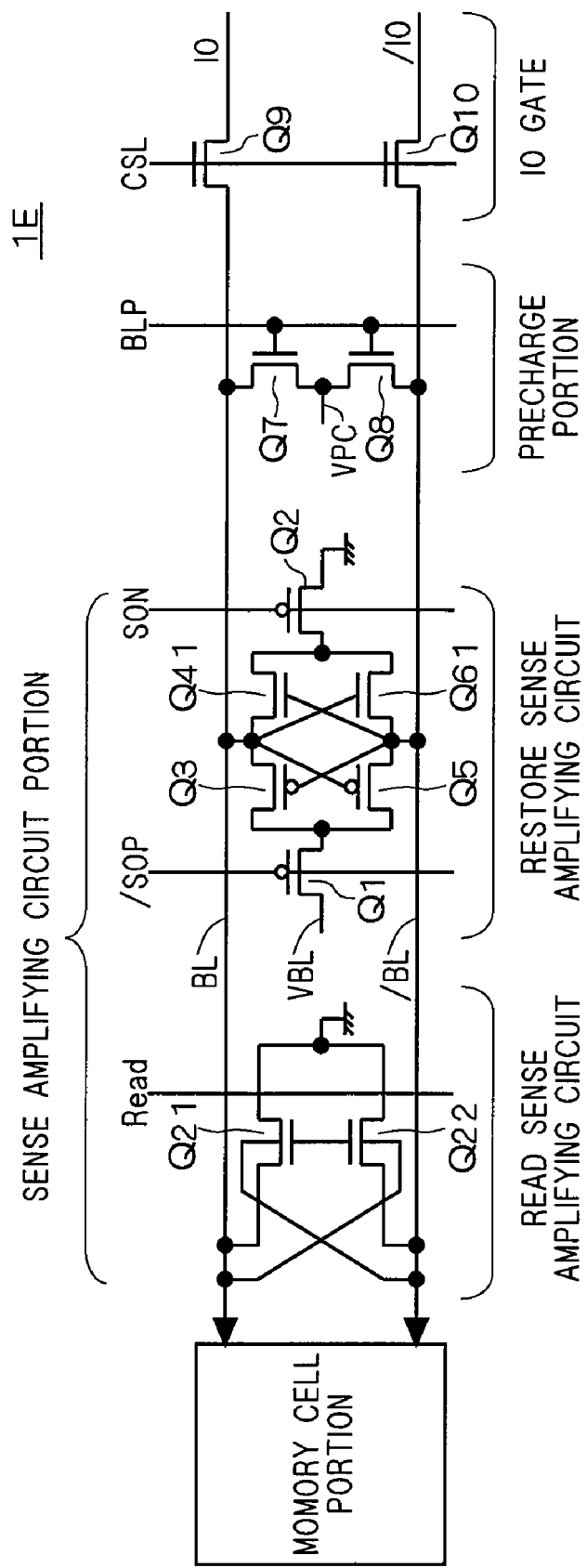
FIG. 21 is a circuit diagram showing the structure of a memory array according to a sixth embodiment of the present invention.

FIG. 21 shows the structure of the memory array 1E of the sixth embodiment. The memory array 1E shown in FIG. 21 has a feature in its sense amplifying circuit portion and as the structure of the memory cell portion, the same 1-bit 1-cell type as the memory array 1A described with reference to FIG. 8 may be adopted and the same 1-bit 2-cell type as the memory array 1C described with reference to FIG. 16 may be used, and thus, representation thereof is omitted. The other parts of the structure are the same as the memory array 1A described with reference to FIG. 8 and like reference numerals are attached to the same components as the memory array 1A, and duplicated description thereof is omitted.

As shown in FIG. 21, the sense amplifying circuit portion of the memory array 1E is constituted of a restore sense amplifying circuit and a read sense amplifying circuit.

The read sense amplifying circuit includes a NMOS transistor Q21 connected between the bit line BL and the ground, and a NMOS transistor Q22 connected in series between the bit line /BL and the ground.

The read activation line Read (which gives read activation signal Read) is connected to the gates of the NMOS transistor Q21 and the NMOS transistor Q22. The bit line /BL is connected to the body region of the NMOS transistor Q21 and the body region of the NMOS transistor Q22 is connected to the bit line BL.

Note that the restore sense amplifying circuit has the same structure as the restore sense amplifying circuit of the memory array 1D shown in FIG. 20.

The read sense amplifying circuit operates as follows upon reading data.

If the read activation line Read is activated upon reading data, the potentials of the bit lines BL and /BL begin to drop by being attracted by the grounding potential.

Here, if data "1" is read out to the bit line BL side, the body potential of the NMOS transistor Q22 in which the body region is connected to the bit line BL is raised, so that current comes to flow easily.

As a result, the potential of the bit line /BL becomes easier to be attracted by the grounding potential, so that the potential of the bit line /BL is dropped further.

If the potential of the bit line /BL is dropped, the body potential of the NMOS transistor Q21 in which the body region is connected to the bit line /BL is dropped, and consequently, it becomes hard to turn ON, whereby the potential of the bit line BL being raised.

By controlling only the potentials of the MOS transistors Q21 and Q22 upon reading data, the threshold of the transistor is changed so as to sense the potentials of the bit lines BL and /BL. As a result, the read sense amplifying circuit can be realized with a small number of the MOS transistors.

G. Seventh Embodiment

Figure 22:
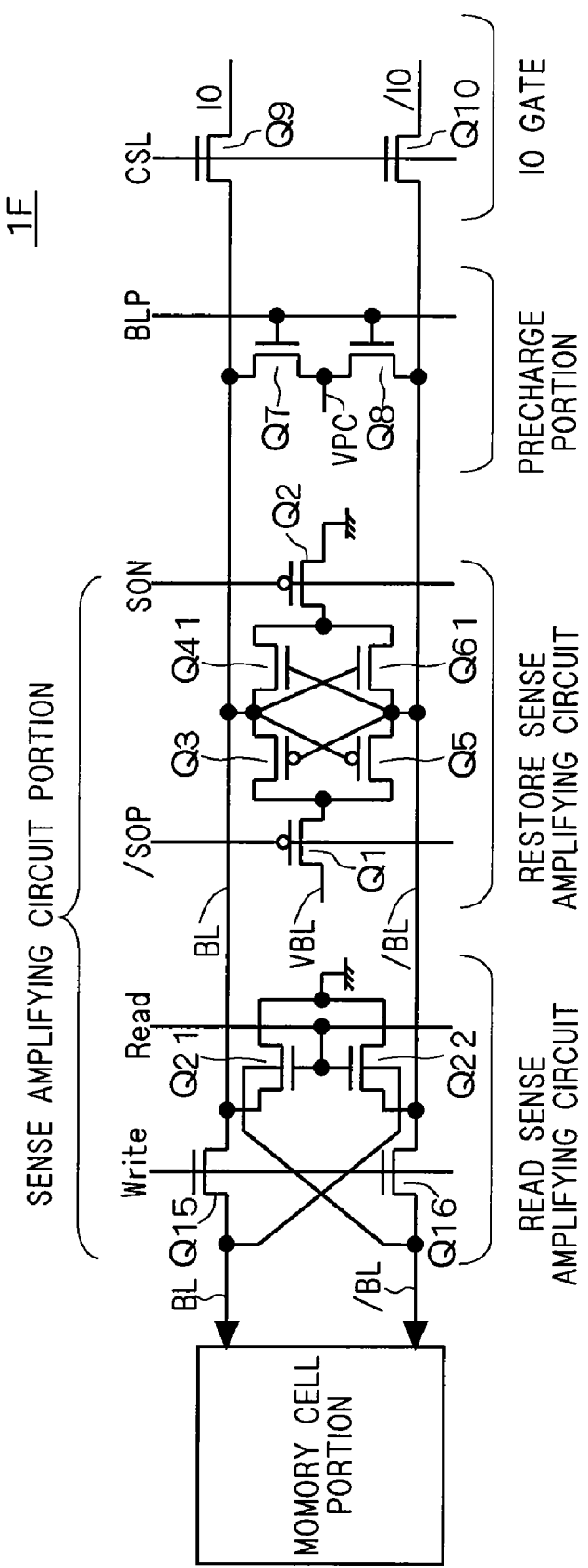
FIG. 22 is a circuit diagram showing the structure of a memory array according to a seventh embodiment of the present invention.

FIG. 22 shows the structure of the memory array 1F of the seventh embodiment. The memory array 1F shown in FIG. 22 has a feature in the sense amplifying circuit portion and as the structure of the memory cell portion, the same 1-bit 1-cell type as the memory array 1A described with reference to FIG. 8 may be adopted and the same 1-bit 2-cell type as the memory array 1C described with reference to FIG. 16 may be adopted. Thus, representation thereof is omitted. The other parts of the structure are the same as the memory array 1A described with reference to FIG. 8 and like reference numerals are attached to the same components as the memory array 1A and duplicated description thereof is omitted.

As shown in FIG. 22, the sense amplifying circuit portion of the memory array 1F is constituted of a restore sense amplifying circuit and a read sense amplifying circuit.

The read sense amplifying circuit includes the NMOS transistor Q21 connected between the bit line BL and the ground, the NMOS transistor Q22, connected in series between the bit line /BL and the ground, a NMOS transistor Q15 interposed in the bit line BL and a NMOS transistor Q16 interposed in the bit line /BL.

The read activation line Read (which gives read activation signal Read) is connected to the gates of the NMOS transistor Q21 and the NMOS transistor Q22. The body region of the NMOS transistor Q21 is connected to the bit line /BL. The body region of the NMOS transistor Q22 is connected to the bit line BL. The body region of the NMOS transistor Q21 is connected to the bit line /BL on a side to which the source of the NMOS transistor Q16 is connected and the body region of the NMOS transistor Q22 is connected to the bit line BL on a side to which the source of the NMOS transistor Q15 is connected.

Write activation line Write (which gives write activation signal Write) is connected to the gates of the NMOS transistors Q15 and Q16.

Note that the restore sense amplifying circuit has the same structure as the restore sense amplifying circuit of the memory array 1D shown in FIG. 20.

The operation of the read sense amplifying circuit upon reading data is basically the same as the read sense amplifying circuit of the memory array 1E described with reference to FIG. 21. However, in the memory array 1F, when data is read out, the read activation line Read is activated while the write activation line Write is deactivated, so as to turn off the NMOS transistors Q15 and Q16, whereby isolating the restore sense amplifying circuit electrically from the bit lines BL and /BL.

Consequently, the operation of the restore sense amplifying circuit can be prevented from being affected by a capacity parasitic on the bit lines BL and /BL, thereby accelerating the sensing operation.

That is, the memory cell portion is connected to the bit lines BL and /BL while a large parasitic capacity accompanying this exists. As for its volume, if the parasitic capacity of the sense amplifying circuit portion is assumed to be 1, the parasitic capacity of other bit lines is about 3.

A time when the potential difference between the bit lines is increased upon reading data is affected by the parasitic capacity accompanying the bit line and if the parasitic capacity is large, a time when the potential difference is increased so that it can be sensed is increased.

However, by separating the restore sense amplifying circuit from the bit lines BL and /BL, the parasitic capacity other than the parasitic capacity existing in the sense amplifying circuit portion is isolated. Thus, a time for the restore sense amplifying circuit to complete its operation (charge-discharge time for capacitor) can be reduced largely, thereby accelerating the sense operation.

As described using FIG. 9(a), after the pre-charge signal BLP is deactivated, data begins to be read out from the memory cell portion and while the write activation line Write is deactivated, potential is supplied to the sense amplifying circuit portion through the bit lines BL and /BL. After the write activation line Write is deactivated, the amplification operation is carried out by the restore sense amplifying circuit and the read sense amplifying circuit. Consequently, there is no problem even if the bit lines BL and /BL are isolated electrically.

At the time of write operation, the write activation line Write is activated and the NMOS transistors Q15 and Q16 are turned ON. Consequently, data written through the IO gate is latched by the restore sense amplifier and, at the same time, can be transmitted to the bit line BL through the NMOS transistors Q15 and Q16.

Note that the write activation signal Write can be created by for example, sense amplifying activation signal S0N and AND processing based on a write instruction signal WRITE (FIG. 7) given from outside.

As described above, the structure of isolating the parasitic capacity of the bit line from the sense amplifying circuit portion may be applied to any one of the memory arrays 1A to 1D shown in the second to fifth embodiment.

H. Eighth Embodiment

Figure 23:
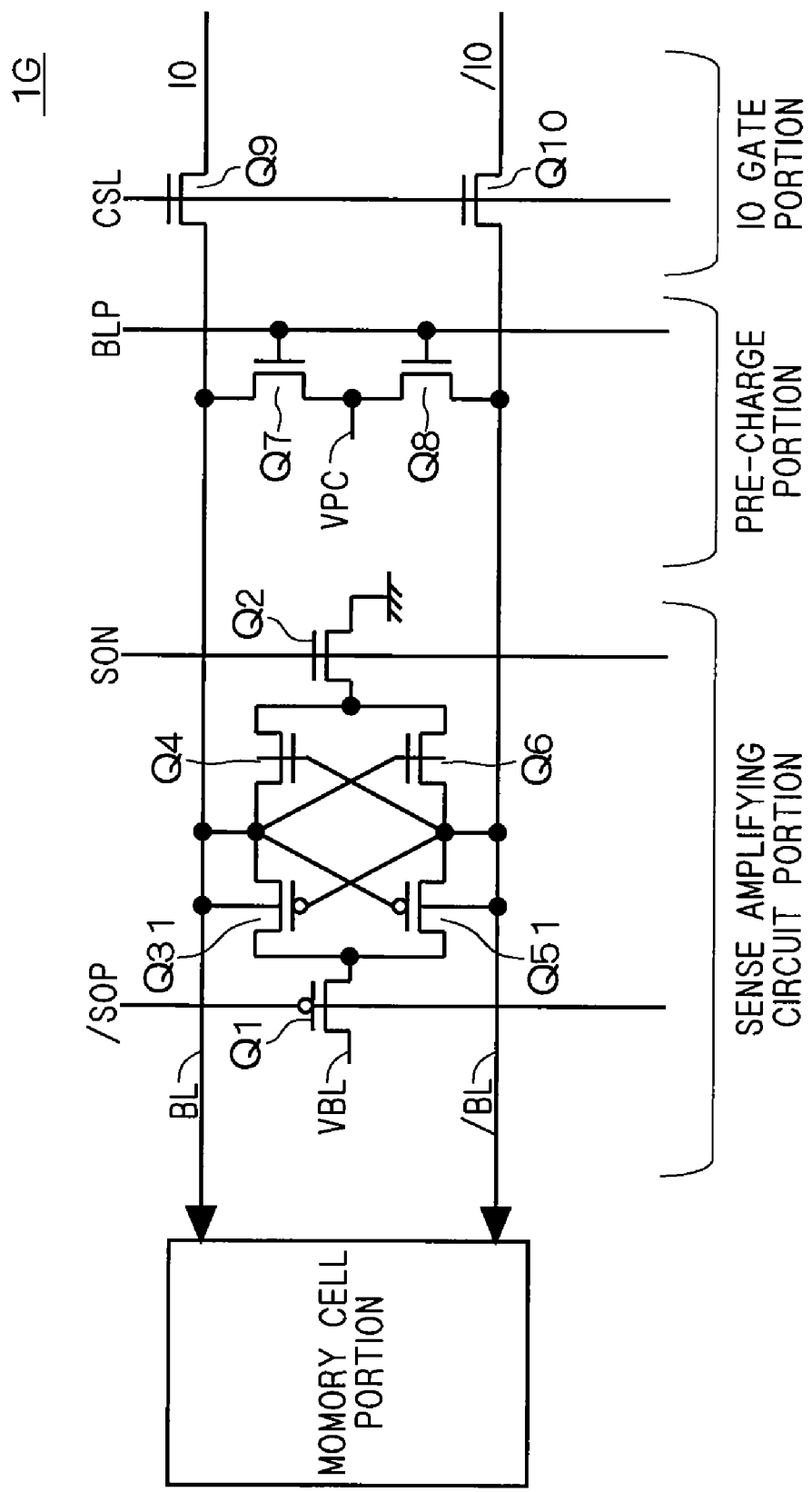
FIG. 23 is a circuit diagram showing the structure of a memory array according to an eighth embodiment of the present invention.

FIG. 23 shows the structure of the memory array 1G of the eighth embodiment. The memory array 1G shown in FIG. 23 has a feature in its sense amplifying circuit portion and as the structure of the memory cell portion, the same 1-bit 1-cell type as the memory array 1A described with reference to FIG. 8 may be adopted and the same 1-bit 2-cell type as the memory array 1C described with reference to FIG. 16 may be used, and thus, representation thereof is omitted. The other parts of the structure are the same as the memory array 1A described with reference to FIG. 8 and like reference numerals are attached to the same components as the memory array 1A, and duplicated description thereof is omitted.

As shown in FIG. 23, the sense amplifying circuit portion of the memory array 1G includes a PMOS transistors Q31 and NMOS transistor Q4, connected in series, and a PMOS transistor Q51 and NMOS transistor Q6, connected in series. The connecting node of the PMOS transistor Q31 and the NMOS transistor Q4 is connected to the bit line BL and gates of the PMOS transistor Q51 and NMOS transistor Q6 are connected to this connecting node. Further, the connecting node of the PMOS transistor Q51 and NMOS transistor Q6 is connected to the bit line /BL and gates of the PMOS transistor Q31 and NMOS transistor Q4 are connected to the connecting node.

Then, the NMOS transistors Q4 and Q6 use the gate/body directly-connected transistor and the body region of the PMOS transistor Q31 is connected to the bit line BL while the body region of the PMOS transistor Q51 is connected to the bit line /BL.

Consequently, all the MOS transistors constituting the sense amplifying circuit can be operated at a low voltage thereby achieving a lower voltage memory array.

If the initial pre-charge voltage VPR of the bit line is grounding potential, on the PMOS transistor side, initially, a vias voltage occurs in which its source is in the bit line drive voltage VBL (for example, ½VDD) and in which the body is in 0V. Thus, it can be said that this structure is suitable for a memory array in which the bit line drive voltage VBL is smaller than a built-in potential (for example, 0.6V) of the PMOS transistor. Although the second to eighth embodiment have been described on the premise of the ND pre-charge method, the structure of the sense amplifying circuit portion of the memory array 1G is effective under the ½VDD pre-charge method also.

However, if the bit line is connected directly to the body region (N type) of the PMOS transistor, a current flows from the body region (½VDD) to the source (GND of sense amplifier) so that malfunction occurs. Thus, it is recommendable to use capacity coupling by P-N junction by connecting the body region (N type) to the P-type diffused region.

In this case, it is more recommendable to carry out body refresh operation, with GND of the sense amplifier set to negative voltage, at each sensing operation, as the initialization method for raised body potential.

I. Ninth Embodiment

In the above-described second to eighth embodiments, the semiconductor memory devices having the 1-bit 1-cell type memory cell portion or the 1-bit 2-cell type memory cell portion have been described. A structure in which a single semiconductor memory device includes both a memory array having the 1-bit 1-cell type memory cell portion and a memory array having the 1-bit 2-cell type memory array can be considered.

As the ninth embodiment, a semiconductor memory device having TTRAM configurable unified memory will be described.

I-I. Structure of Device

I-I-1. Entire Structure

Figure 24:
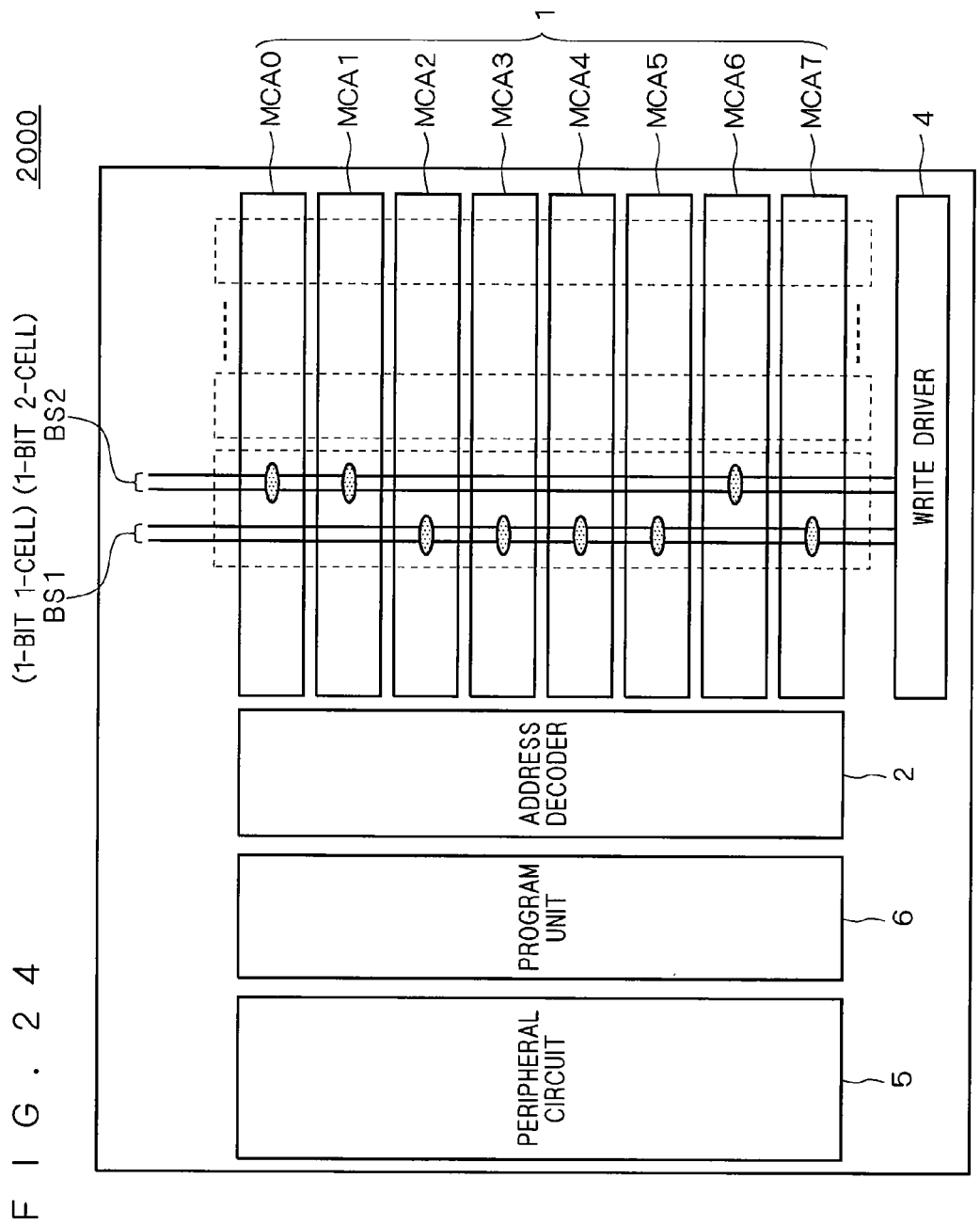
FIG. 24 is a block diagram showing the entire structure of the semiconductor memory device according to a ninth embodiment of the present invention.

FIG. 24 is a block diagram showing the entire structure of a semiconductor memory device 2000 having the configurable unified memory. As shown in FIG. 24, in the semiconductor memory device 2000, the memory array 1 is divided into eight memory array blocks MCA0 to MCA7.

The memory array block is a memory array containing plural word lines and plural bit lines and may be handled as a bank (block which can be accessed through low address independently via an external signal). Note that each memory array block includes a sense amplifying circuit portion, pre-charge portion, IO gate portion and the like, and representation of each is omitted.

In FIG. 24, the memory array 1 is constituted of eight memory array blocks and each block is programmable by the 1-bit 1-cell type or the 1-bit 2-cell type.

Two-way bus structure is adopted to connect an IO bus which is input/output from each bank to a 1-bit 1-cell type block and 1-bit 2-cell type block individually. FIG. 24 shows an example that an IO bus BS1 is connected to 1-bit 1-cell type memory array blocks MCA2, MCA3, MCA4, MCA5 and MCA7 and an IO bus BS2 is connected to 1-bit 2-cell type memory array blocks MCA0, MCA1 and MCA6. Note that the IO bus BS1 and BS2 are connected to the write driver 4 containing a preamplifier.

With such a structure, the 1-bit 2-cell type memory array block can be handled as a cache memory and the 1-bit 1-cell type memory array block can be handled as a main memory by connecting the IO bus BS2 to a high speed bus (cache bus) and the IO bus BS1 to a low speed bus (main memory bus). Consequently, the memory array 1 can be operated as a configurable unified memory.

I-1-2. Structure of Program

A structure for programming the memory array block to the 1-bit 1-cell type or the 1-bit 2-cell type is the program unit 6 which is disposed between the address decoder 2 and the peripheral circuit.

Figure 25:
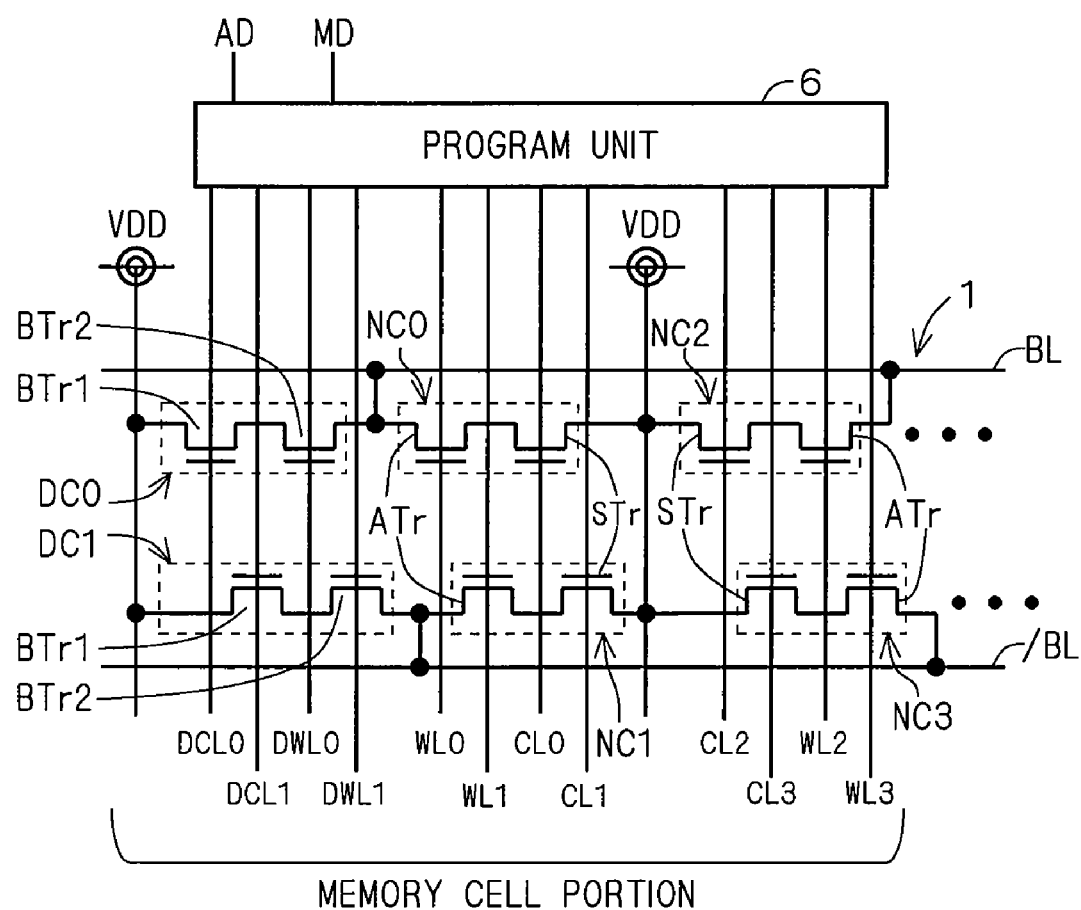
FIG. 25 is a diagram showing a connection relation between the memory cell portion and the program unit.

FIG. 25 shows a connection relation between a memory cell portion and the program unit 6 by taking a memory array block in the memory array 1 as an example. Note that representation of the address decoder between the both is omitted for convenience.

The program unit 6 programs the memory cell portion to the 1-bit 1-cell type or the 1-bit 2-cell type by controlling activation and deactivation of the dummy word line, word line and charge line given to the memory cell portion based on an external address signal AD and mode change-over signal MD given from outside.

The memory cell portion shown in FIG. 25 is configured to cope with the 1-bit 1-cell type like the memory array 1A described with reference to FIG. 8 and has the dummy cell as well as the normal cell. Note that like reference numerals are attached to the same components as the memory array 1A and duplicated description thereof is omitted.

Figure 26:
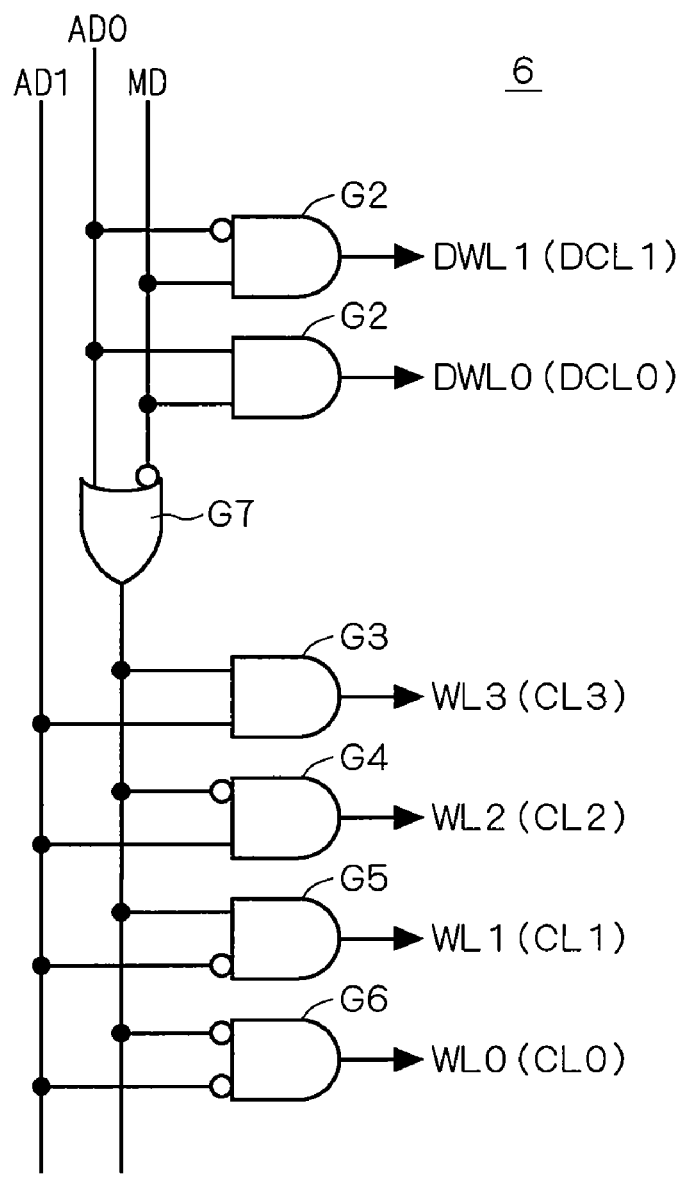
FIG. 26 is a diagram showing an example of the structure of the program unit.

FIG. 26 is a diagram showing an example of the structure of the program unit 6. As shown in FIG. 26, the program unit 6 has logic gates G1 to G7 and determines an output logic of each logic gate based on external address signals AD0, AD1 and mode change-over signals MD. By giving the output logic to the dummy word line, word line and charge line, the memory cell portion is programmed to the 1-bit 1-cell type or 1-bit 2-cell type.

That is, in the program unit 6 shown in FIG. 26, AND gates G1, G2 and OR gate G7 receive an external address signal AD0 and mode change-over signal MD and AND gates G3 to G6 receive outputs of external address signal AD1 and an output of the OR gate G7.

Each logic gate is constructed as follows.

One of inputs to the AND gate G1 is inverting input and an external address signal AD0 is given as that input. Its output is given to a dummy word line DWL1 and dummy charge line DCL1.

An output of the AND gate G2 is given to a dummy word line DWL0 and dummy charge line DCL0.

One of inputs to the OR gate G7 is inverting input and a mode change-over signal MD is given as that input and its output is given to the AND gates G3 to G6.

An output of the AND gate G3 is given to the word line WL3 and the charge line CL3.

One of inputs to the AND gate G4 is inverting input and an output of the OR gate G7 is given as that input and its output is given to the word line WL2 and charge line CL2.

One of inputs to the AND gate G5 is inverting input and an external address signal AD1 is given as that input and its output is given to the word line WL1 and charge line CL1.

Two inputs to the AND gate G6 are inverting inputs and its output is given to the word line WL0 and the charge line CL0.

I-2. Operation of Device

FIG. 27 and FIG. 28 show outputs to inputs in the program unit 6 as a truth value table.

FIG. 27 shows a truth value table of programming the memory cell portion to the 1-bit 1-cell type by means of the program unit 6.

If it is programmed to the 1-bit 1-cell type as shown in FIG. 27, the mode change-over signal MD is given as "H(High)".

If for example, the external address signals AD0 and AD1 are both signal "L (Low)", the word line WL3 and charge line CL3 are supplied with signal "L", the word line WL2 and charge line CL2, signal "L", word line WL1 and charge line CL1, signal "L" and word line WL0 and charge line CL0, signal "H".

Further, the dummy word line DWL1 and dummy charge line DCL1 are supplied with signal "H" and the dummy word line DWL0 and dummy charge line DCL0 are supplied with signal "L".

In the above described case, the dummy cell DC1 and the normal cell NC0 are selected in the memory cell portion shown in FIG. 25 and data of the normal cell NC0 and the dummy cell DC1 are read out to the bit lines BL and /BL. Consequently, the memory array block having the memory cell portion performs the 1-bit 1-cell action.

FIG. 28 shows a truth value table of a case where the memory cell portion is programmed to the 1-bit 2-cell type by means of the program unit 6.

If it is programmed to the 1-bit 2-cell type as shown in FIG. 28, the mode change-over signal MD is given as "L".

If for example, the external address signal AD1 is signal "L (Low)", the word line WL3 and charge line CL3 are supplied with signal "L", word line WL2 and charge line CL, signal "L", word line WL1 and charge line CL1, signal "H", and word line WL0 and charge line CL0, signal "H". In this case, because the external address signal AD0 may be supplied with any one of "L" and "H", "d(don't care term)" is given.

Further, the dummy word line DWL1 and dummy charge line DCL1 are supplied with signal "L" and the dummy word line DWL0 and dummy charge line DCL0 are supplied with signal "L".

In the above case, no dummy cell DC0 or DC1 is selected in the memory cell portion shown in FIG. 25 and instead, the normal cells NC0 and NC1 are selected. Then, data of the normal cell NC0 and normal cell NC1 are read out to the bit lines BL and /BL, so that the memory array block having the memory cell portion performs the 1-bit 2-cell action.

Programming a combination of signals to be provided to the charge line, word line and dummy word line means programming the memory cell program to the 1-bit 1-cell type or the 1-bit 2-cell type.

I-3. Characteristic Operation and Effect

As described above, in the semiconductor memory device 2000 shown in FIG. 24, the memory array 1 is constituted of plural memory array blocks and each block can be programmed to the 1-bit 1-cell type or 1-bit 2-cell type arbitrarily. Thus, the memory array 1 can be used as a configurable unified memory.

That is, because the quantity of read signals is large in the 1-bit 2-cell type memory array block, high speed sensing operation is enabled, so that high speed access is enabled. Thus, this is suitable for a cache memory which is required to read out rapidly.

Because the quantity of signals becomes double theoretically, the lower limit margin of the power source voltage VDD is increased, whereby enabling low voltage operation.

Because information is memorized by two memory cells, the refresh time is extended, so that standby current can be reduced by reducing a data holding current.

On the other hand, because in the 1-bit 1-cell type memory array block, the quantity of held data is double the case of the 1-bit 2-cell type, it is suitable for a main memory which requires a large quantity of held data.

Consequently, the unified configurable memory capable of programming three modes can be achieved, that is, high-speed mode suitable for a cache memory being programmed by applying the power source voltage VDD under the 1-bit 2-cell type, power saving mode which provides a low speed operation and has a low standby voltage, by applying the power source voltage ½VDD under the 1-bit 2-cell type, large capacity memory mode suitable for a large capacity memory, by applying the power source voltage VDD under the 1-bit 1-cell type.

I-4. Modifications

Although the above description has stated that the 1-bit 1-cell type or the 1-bit 2-cell type is programmed in the unit of the memory array block, the type can be changed depending on a portion within the same memory block, so that the memory array can be classified depending on the function further in detail.

In that case, at the time of the 1-bit 1-cell operation, data is written into the memory region assuming the 1-bit 2-cell operation.

For example, when the refresh operation is carried out on an assumption that data is to be written into only a memory cell of low address of odd number, an operation of writing opposite data to the memory cell of the low address of odd number into the memory cell of low address of even number is necessary.

To the contrary when changing from the 1-bit 2-cell operation to the 1-bit 1-cell operation, data of a memory cell of low address of any one of the even number and odd number is neglected.

J. Plan Layout of TTRAM

Figure 29:
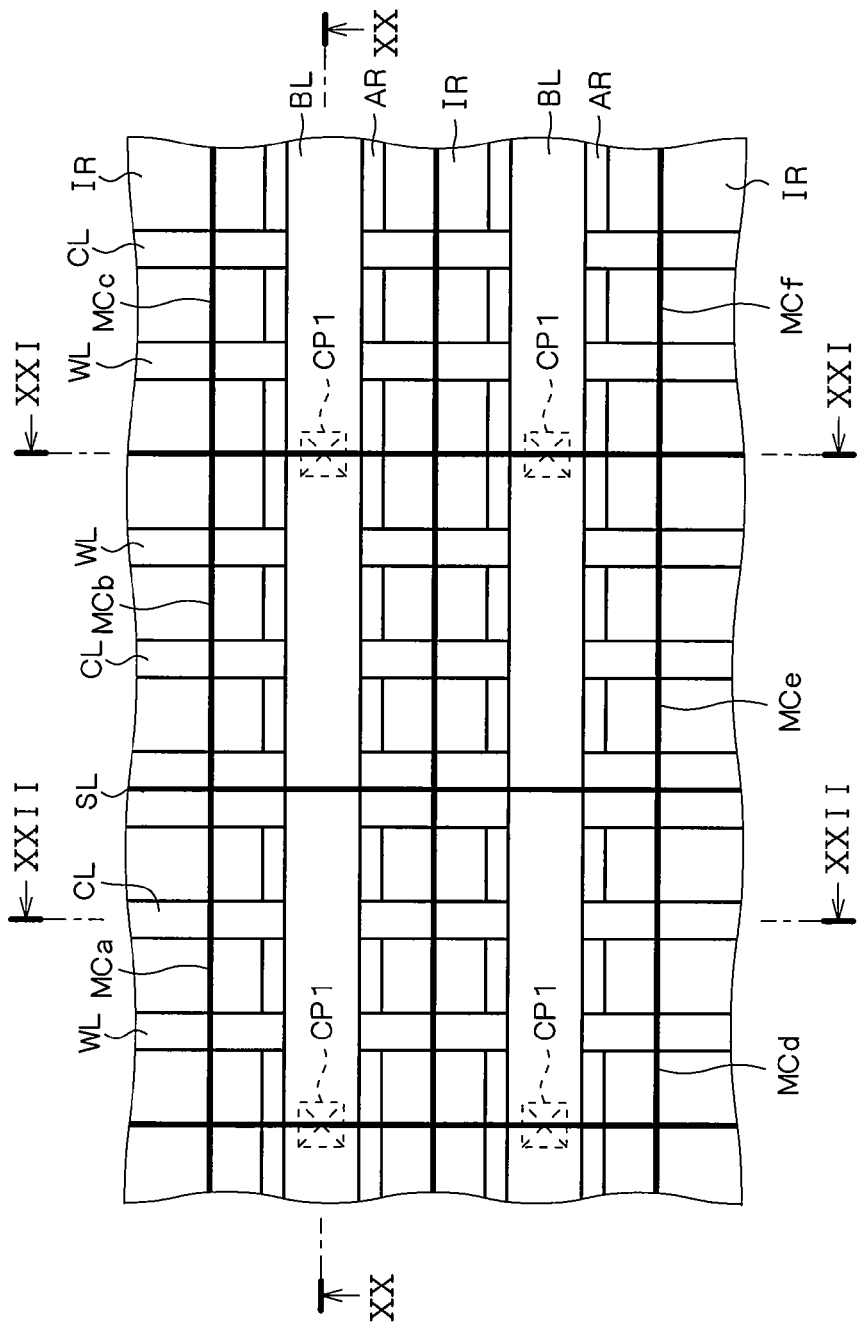
FIG. 29 is a diagram showing an example of a plan layout of the semiconductor memory device.
Figure 30:
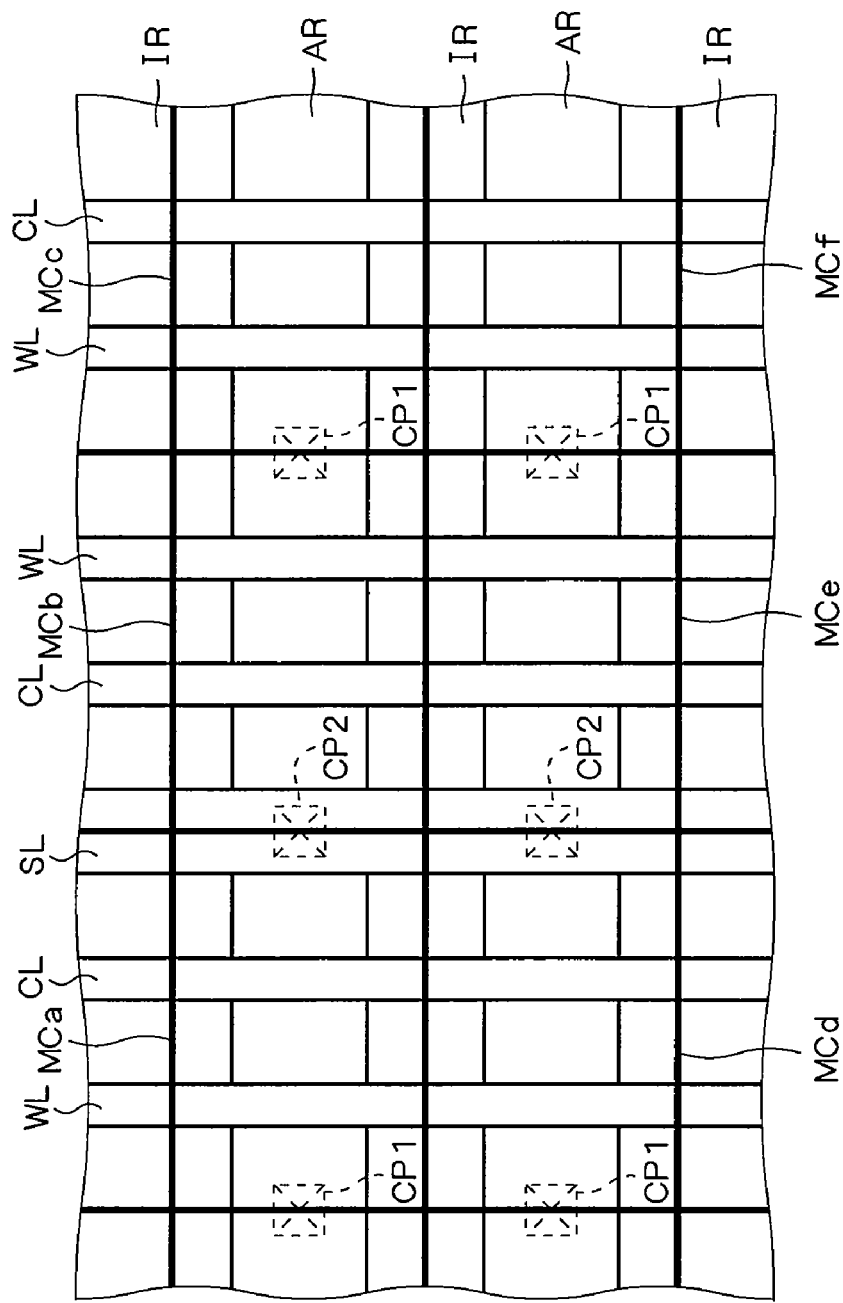
FIG. 30 is a diagram showing an example of a plan layout of the semiconductor memory device.
Figure 31:
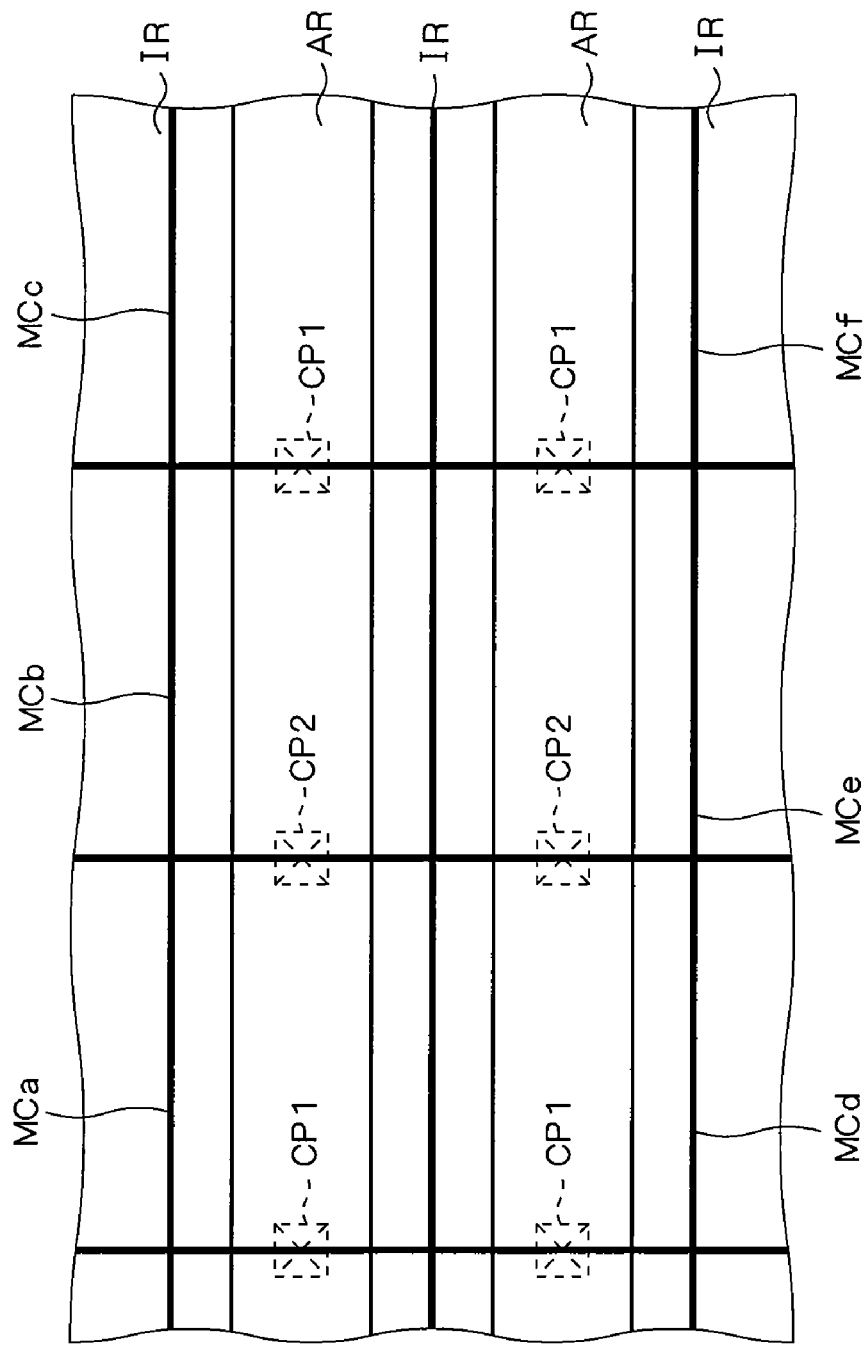
FIG. 31 is a diagram showing an example of a plan layout of the semiconductor memory device.

FIG. 29 to FIG. 31 show an example of the plan layout of the TTRAM. If the bit line BL is omitted from FIG. 29 to clarify the layout of each layer, FIG. 30 is obtained and if the word line WL, the charge line CL and the source line SL are omitted from FIG. 30, FIG. 31 is obtained.

Figure 32:
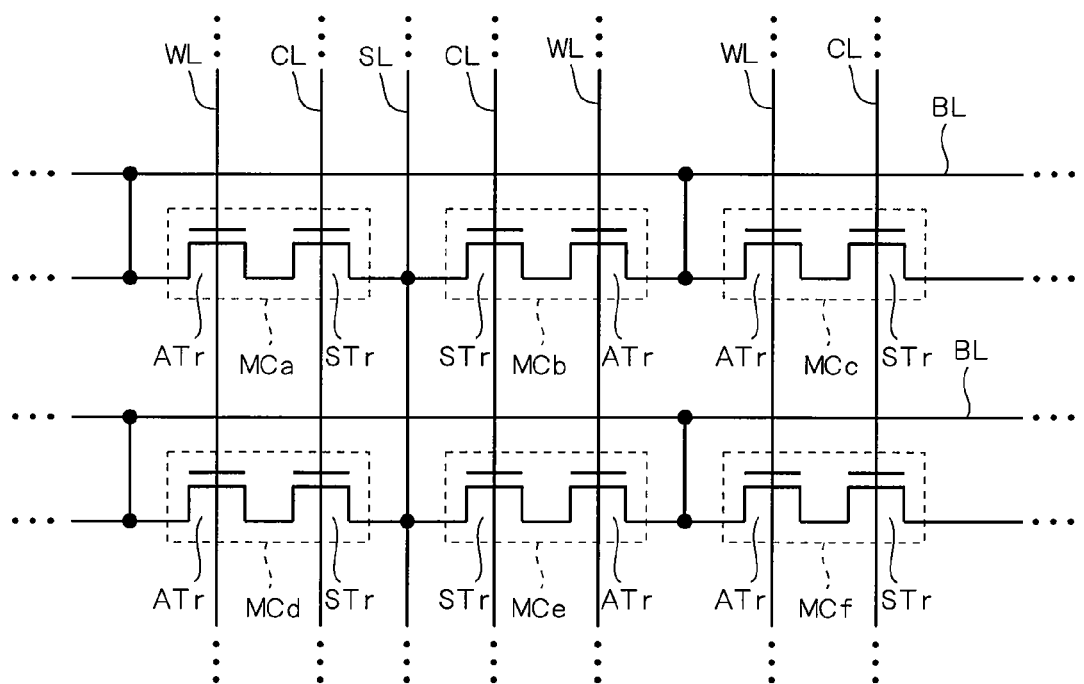
FIG. 32 is a circuit diagram showing a partially extracted portion of the memory array of the TTRAM.
Figure 33:
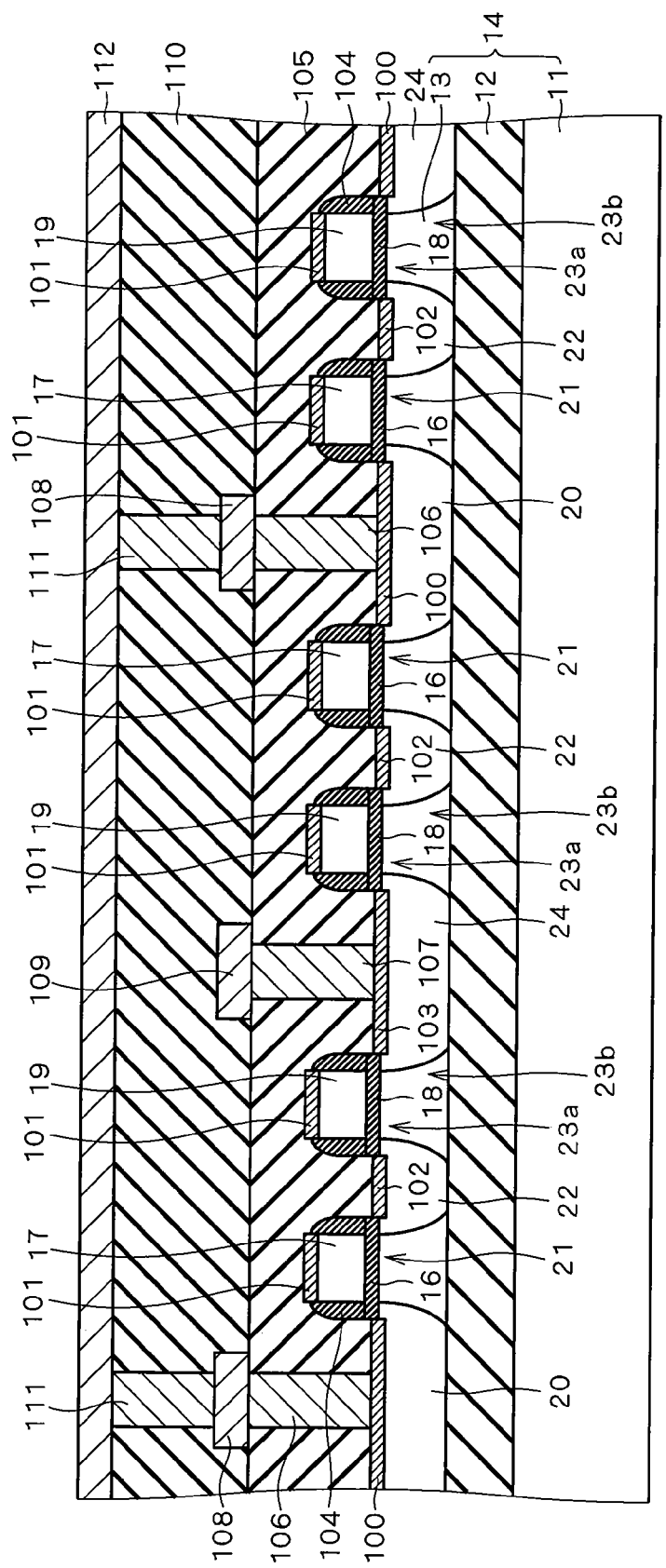
FIG. 33 is a sectional view showing the sectional structure of the semiconductor memory device.
Figure 34:
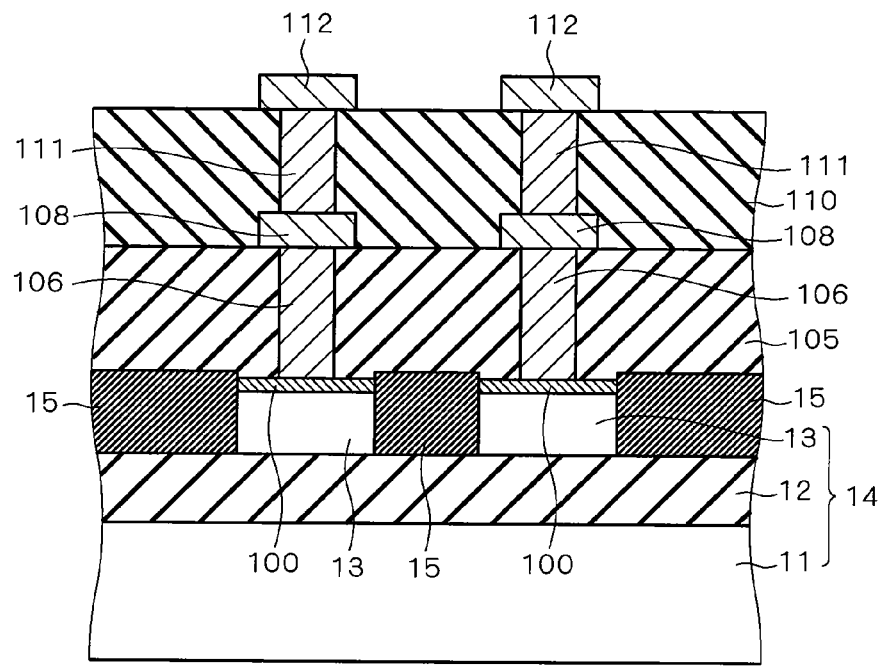
FIG. 34 is a sectional view showing the sectional structure of the semiconductor memory device.
Figure 35:
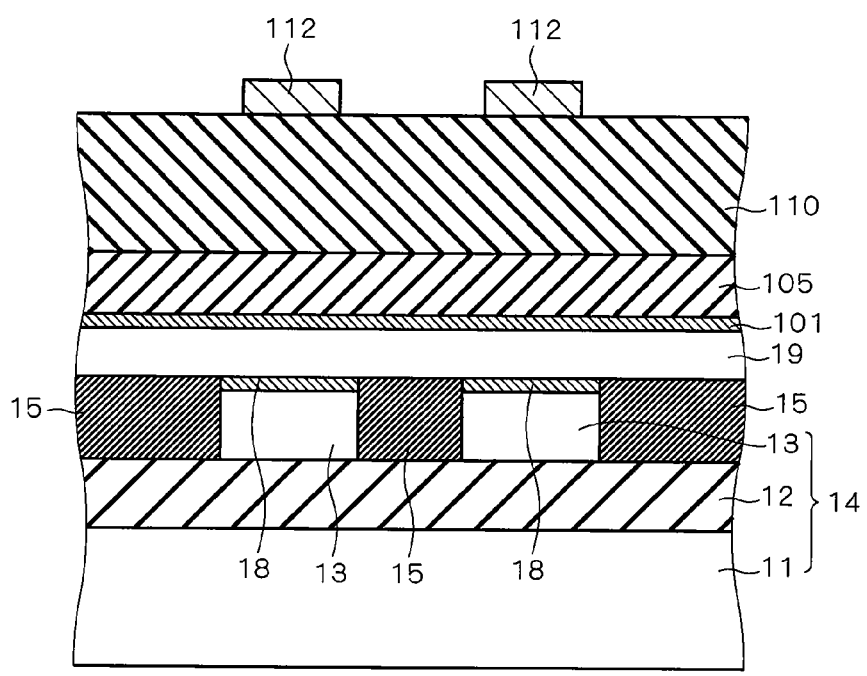
FIG. 35 is a sectional view showing the sectional structure of the semiconductor memory device.

FIG. 32 is an equivalent circuit schematic corresponding to the layout shown in FIG. 29. Further, FIGS. 33, 34 and 35 are sectional views showing the structure of a section taken along the line XX-XX, line XXI-XXI and line XXII-XXII shown in FIG. 29.

As shown in FIG. 29, the device separating region IR and the element formation region AR are formed along a first direction. The element isolation insulating film 15 indicated in FIGS. 34, 35 is formed in the device formation region IR. That is, if the element isolation insulating film 15 is formed along the first direction, the device formation region AR extending in the first direction is defined by the element isolation insulating film 15. The element formation area AR is extended in the first direction not divided by the element isolation insulating film 15.

As shown in FIG. 30, the word line WL, the charge line CL and the source line SL are formed to extend along a second direction. The second direction is a direction perpendicular to the first direction.

The charge line CL is formed on both sides of the source line SL and the word line WL is formed outside of (opposite side to the source line SL) the charge line CL. An adjoining word line WL is formed outside of (opposite side to the charge line CL) the word line WL. The source line SL is formed as a first layer wiring in the multilayer wiring structure and connected to the device formation area AR through a contact plug CP2.

As shown in FIG. 29, the bit line BL is formed to extend in the first direction above the element formation area AR. The bit line BL is formed as a second layer wiring in the multilayer wiring structure and connected to the element formation region AR through the contact plug CP1. Note that the bit line BL may be formed as the first layer wiring and the source line SL may be formed as a second layer wiring.

Plural memory cells MC (MCa to MCf) are disposed along the bit line BL. The bit line BL is shared by the plural memory cells MC arranged in the first direction. A source line SL is shared by two memory cells MC adjoining in the first direction.

In the example shown in FIG. 29, the source line SL is shared by the memory cell MCa on the left end and the memory cell MCb in the center. Further, the word line WL, the charge line CL and the source line SL are shared by the plural memory cells MC arranged in the second direction.

As shown in FIG. 32, each memory cell MC has the storage transistor STr and the access transistor ATr. Because the structure and operation of the storage transistor STr and the access transistor ATr have been described with reference to FIG. 1, description thereof is omitted.

As shown in FIG. 33, the SOI substrate 14 has a structure in which the silicon substrate 11, the buried oxide film layer 12 and the silicon layer 13 are overlaid in this order.

The storage transistor STr includes the N type impurity-diffused regions 22, 24, the channel formation region 23a, the charge accumulating region 23b, the gate oxide film 18 and the gate electrode 19 corresponding to the charge line CL shown in FIGS. 29, 30. The impurity-diffused regions 22, 24 are formed from the top face of the silicon layer 13 to reach the top face of the buried oxide film 12 such that they oppose each other across the channel formation region 23a specified within the top face of the silicon layer 13. The gate oxide film 18 is formed on the channel formation region 23a and the gate electrode 19 is formed on the gate oxide film 18. The charge accumulating region 23b is formed in the lower portion of the channel formation area 23a.

The access transistor ATr includes the N type impurity-diffused regions 20, 22, the channel formation region 21, the gate oxide film 16 and the gate electrode 17 corresponding to the word line WL shown in FIGS. 29, 30. The impurity-diffused region 20 is formed from the top face of the silicon layer 13 to reach the top face of the oxide film layer 12 and opposes the impurity-diffused region 22 across the channel formation region 21 defined within the top face of the silicon layer 13. The gate oxide film 16 is formed on the channel formation region 21 and the gate electrode 17 is formed on the gate oxide film 16.

A side wall spacer 104 compose of insulation film is formed on the side faces of the gate electrodes 17, 19. Silicide layer 100 is formed on the top face of the impurity-diffused region 20 and silicide layer 102 is formed on the top face of the impurity-diffused region 22. Silicide layer 103 is formed on the top face of the impurity-diffused region 24 and silicide layer 101 is formed on the top face of the gate electrodes 17, 19.

The contact plug 106 connected to the silicide layer 100 and the contact plug 107 connected to the silicide layer 103 are formed within the interlayer insulation film 105. Metallic film 108 connected to the contact plug 106 and metallic wiring 109 connected to the contact plug 107 are formed on the interlayer insulation film 105. The contact plug 107 corresponds to the contact plug CP2 shown in FIG. 30. The metallic wiring 109 corresponds to the source line SL shown in FIGS. 29, 30.

A contact plug 111 connected to the metallic film 108 is formed within the interlayer insulation film 110. A metallic wiring 112 connected to the contact plug 111 is formed on the interlayer insulation film 110. The contact plugs 106, 111 and the metallic film 108 correspond to the contact plug CP1 shown in FIG. 29. The metallic wiring 112 corresponds to the bit line BL shown in FIG. 29.

As shown in FIG. 34 and FIG. 35, so-called full-trench type element isolation insulating film 15 is formed from the top face of the silicon layer 13 to reach the top face of the buried oxide film layer 12. That is, the element isolation insulating film 15 has a bottom face making contact with the top face of the buried oxide film layer 12.

As shown in FIGS. 29 to 31, the element formation region AR is formed to extend continuously in the first direction and the bit line BL is extended in the first direction. The charge line CL, word line WL and source line SL are extended in the second direction. Then, the bit line BL is shared by the plural memory cells MC disposed in line in the first direction and the source line SL is shared by the two memory cells MC adjoining along the first direction.

Therefore, the element isolation insulating film 15 does not need to be formed between the memory cells MC adjoining along the first direction, thereby the area of the memory array region being reduced. Additionally, because a single source line SL is shared by the two memory cells MC adjoining in the first direction, the area of the memory cell array can be reduced further.

Although the present invention has been described in detail, the above description is an exemplification in all aspects and the present invention is not restricted thereto. It should be understood that a countless number of modifications not exemplified can be expected not departing from the range of the present invention.

The invention claimed is:

1. A semiconductor memory device including a memory array portion having a plurality of memory cells (MC) arranged in a matrix, charge line (CL), word line (WL) and bit lines (BL), in which each of said plurality of memory cells has an access transistor (ATr) and a storage transistor (STr) connected in series between said one of bit lines (BL) and a power source potential (VDD), the gate of said storage transistor (STr) is connected to said charge line (CL) and the gate of said access transistor (ATr) is connected to said word line (WL), said storage transistor (STr) and said access transistor (ATr) are isolated electrically from other adjoining memory cells (MC), by switching the potential of a connection node of said storage transistor (STr) and said access transistor (ATr) to a constant potential or a floating condition by turning ON/OFF said access transistor (ATr), the potential of a body region (23b) of said storage transistor (STr) is set to a high level or a low level so as to memorize binary data, wherein by activating said word line (WL) and said one of bit lines (BL) in parallel with said storage transistor (STr) set to OFF, the potential conditions of said charge line (CL), said word line (WL) and said one of bit lines (BL) are controlled so that the potential of said body region (23b) is raised by a leak current flowing from a drain side toward said body region (23b) in a period until said storage transistor (STr) is turned ON.

2. The semiconductor memory device according to claim 1, wherein said bit line (BL) are disposed such that a first bit lines (BL) and a second bit line (/BL) make a pair, the plurality of said memory cells (MC) include a first memory cell in which said access transistor (ATr) is connected to said first bit line (BL), and a second memory cell in which said access transistor (ATr) is connected to said second bit line (/BL), said memory array portion includes
a first reference potential applying means for providing a reference potential to said first bit line (BL) and
a second reference potential applying means for providing a reference potential to said second bit line (/BL),
when data is read out from said first memory cells (NC0, NC2), a second reference potential applying means is selected in parallel, and
when data is read out from said second memory cells (NC1, NC3), the first reference potential applying means is selected in parallel.

3. The semiconductor memory device according to claim 2, wherein said first reference potential applying means includes a first and second MOS transistors (BTr1, BTr2), connected in series between the power source potential (VDD) and said first bit line (BL),
said second reference potential applying means includes
a third and fourth MOS transistors (BTr1, BTr2), connected in series between said power source potential (VDD) and said second bit line (/BL),
said first to fourth MOS transistors are body fixed transistors in which a body region is fixed to source potential.

4. The semiconductor memory device according to claim 2, wherein said first reference potential applying means includes a first transistor (DT0) connected between a reference voltage line (VREF) and said first bit line (BL), and
said second reference potential applying means includes
a second transistor (DT1) connected between said reference voltage line (VREF) and said second bit line (/BT).

5. The semiconductor memory device according to claim 2 wherein said memory array portion includes
a sense amplifying circuit portion for amplifying a potential difference between said first and second bit lines (BL, /BL) and
said sense amplifying circuit portion has a cross couple circuit in which a first inverter and a second inverter are cross-connected while NMOS transistors (Q4, Q6) of said first and second inverters are so constructed that a gate and a body region are connected electrically.

6. The semiconductor memory device according to claim 5 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

7. The semiconductor memory device according to claim 1 or claim 5 wherein said memory array portion has a sense amplifying circuit portion for amplifying a potential difference between said first and second bit lines (BL, /BL),
said sense amplifying circuit portion has a first and second NMOS transistors (Q11, Q12) connected in series between said first bit line (BL) and a ground and a third and fourth NMOS transistors (Q13, Q14) connected in series between said second bit line (/BL) and the ground,
said sense amplifying circuit portion includes
a first sense amplifying circuit in which a gate of said first NMOS transistor (Q11) is connected to said second bit line (/BL), a gate of said second NMOS transistor (Q13) is connected to said first bit line (BL) and a read activation signal (Read) to be activated upon reading data is supplied to the gates of said second and fourth NMOS transistors (Q12, Q14), and
a second sense amplifying circuit constituted of a cross couple circuit in which a first inverter and a second inverter are cross-connected,
said first and third NMOS transistors (Q11, Q13) are so constructed that the gate and body region are connected electrically.

8. The semiconductor memory device according to claim 7 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

9. The semiconductor memory device according to claim 2 wherein said memory array portion has a sense amplifying circuit portion for amplifying a potential difference between said first and second bit lines (BL, /BL),
said sense amplifying circuit portion has a first NMOS transistor (Q21), connected between said first bit line (BL) and a ground, and a second NMOS transistor (Q22), connected between said second bit line (/BL) and the ground,
said sense amplifying circuit portion comprising
a first sense amplifying circuit in which a body region of said first NMOS transistor (Q21) is connected to said second bit line (/BL),
a body region of said second NMOS transistor (Q22) is connected to said first bit line (BL) and
a read activation signal (Read) to be activated upon reading data is supplied to gates of said first and second NMOS transistors (Q21, Q22), and
a second sense amplifying circuit constituted of a cross couple circuit in which a first inverter and a second inverter are cross-connected.

10. The semiconductor memory device according to claim 9 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

11. The semiconductor memory device according to claim 2 wherein said memory array portion has a sense amplifying circuit portion for amplifying a potential difference between said first and second bit lines (BL, /BL),
said sense amplifying circuit portion has a cross couple circuit in which a first inverter and a second inverter are cross-connected,
wherein each NMOS transistor (Q4, Q6) of said first and second inverters is so constructed that the gate and body are connected electrically,
a PMOS transistor (Q31) of said first inverter is so constructed that a body region is connected to said first bit line (BL) and
a PMOS transistor (Q51) of said second inverter is so constructed that the body region is connected to said second bit line (/BL).

12. The semiconductor memory device according to claim 11 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

13. The semiconductor memory device according to claim 1, wherein said bit line (BL) is disposed such that a first bit line (BL) and a second bit line (/BL) make a pair, said plurality of memory cells (MC) include
a first memory cell in which said access transistor (ATr) is connected to said first bit line (BL), and
a second memory cell in which said access transistor (ATr) is connected to said second bit line (/BL),
a pair of complementary data are memorized in said first memory cell (NC01) and said second memory cell (NC02), and
said charge line (CL) and said word line (WL) are connected to said first memory cell (NC01) and said second memory cell (NC02) in common so as to read out said complementary data in parallel upon reading data.

14. The semiconductor memory device according to claim 13 wherein said memory array portion includes
a sense amplifying circuit portion for amplifying a potential difference between said first and second bit lines (BL, /BL) and
said sense amplifying circuit portion has a cross couple circuit in which a first inverter and a second inverter are cross-connected while NMOS transistors (Q4, Q6) of said first and second inverters are so constructed that a gate and a body region are connected electrically.

15. The semiconductor memory device according to claim 14 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

16. The semiconductor memory device according to claim 13 wherein said memory array portion has a sense amplifying circuit portion for amplifying a potential difference between said first and second bit lines (BL, /BL),
said sense amplifying circuit portion has a first and second NMOS transistors (Q11, Q12) connected in series between said first bit line (BL) and a ground and a third and fourth NMOS transistors (Q13, Q14) connected in series between said second bit line (/BL) and the ground,
said sense amplifying circuit portion includes
a first sense amplifying circuit in which a gate of said first NMOS transistor (Q11) is connected to said second bit line (/BL), a gate of said second NMOS transistor (Q13) is connected to said first bit line (BL) and a read activation signal (Read) to be activated upon reading data is supplied to the gates of said second and fourth NMOS transistors (Q12, Q14), and
a second sense amplifying circuit constituted of a cross couple circuit in which a first inverter and a second inverter are cross-connected,
said first and third NMOS transistors (Q11, Q13) are so constructed that the gate and body region are connected electrically.

17. The semiconductor memory device according to claim 16 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

18. The semiconductor memory device according to claim 13 wherein said memory array portion has a sense amplifying circuit portion for amplifying a potential difference between said first and second bit lines (BL, /BL),
said sense amplifying circuit portion has a first NMOS transistor (Q21), connected between said first bit line (BL) and a ground, and a second NMOS transistor (Q22), connected between said second bit line (/BL) and the ground,
said sense amplifying circuit portion comprising
a first sense amplifying circuit in which a body region of said first NMOS transistor (Q21) is connected to said second bit line (/BL),
a body region of said second NMOS transistor (Q22) is connected to said first bit line (BL) and
a read activation signal (Read) to be activated upon reading data is supplied to gates of said first and second NMOS transistors (Q21, Q22), and
a second sense amplifying circuit constituted of a cross couple circuit in which a first inverter and a second inverter are cross-connected.

19. The semiconductor memory device according to claim 18 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

20. The semiconductor memory device according to claim 13 wherein said memory array portion has a sense amplifying circuit portion for amplifying a potential difference between said first and second bit lines (BL, /BL),
said sense amplifying circuit portion has a cross couple circuit in which a first inverter and a second inverter are cross-connected,
wherein each NMOS transistor (Q4, Q6) of said first and second inverters is so constructed that the gate and body are connected electrically,
a PMOS transistor (Q31) of said first inverter is so constructed that a body region is connected to said first bit line (BL) and
a PMOS transistor (Q51) of said second inverter is so constructed that the body region is connected to said second bit line (/BL).

21. The semiconductor memory device according to claim 20 further comprising a first and second MOS transistors (Q15, Q16) interposed between said first and second bit lines (BL, /BL) and said sense amplifying circuit portion, wherein
a write activation signal (Write) which turns ON the first and second MOS transistor upon writing data and turns OFF upon reading data is supplied to the gates of the first and second MOS transistors.

22. A semiconductor memory device including a memory array portion having a plurality of memory cells (MC) arranged in a matrix, charge line (CL), word line (WL) and bit lines (BL), in which each of the plurality of said memory cells has an access transistor (ATr) and a storage transistor (STr) connected in series between said one of bit lines (BL) and a power source potential (VDD),
the gate of said storage transistor (STr) is connected to said charge line (CL) and the gate of said access transistor (ATr) is connected to said word line (WL),
said storage transistor (STr) and said access transistor (ATr) are isolated electrically from adjoining other memory cells (MC),
by switching the potential of a connection node of said storage transistor (STr) and said access transistor (ATr) to a constant potential or a floating condition by turning ON/OFF said access transistor (ATr), the potential of a body region (23b) of said storage transistor (STr) is set to a high level or a low level so as to memorize binary data, wherein, said bit line (BL) is disposed such that a first bit line (BL) and a second bit line (/BL) make a pair, said plurality of memory cells (MC) include a first memory cell in which said access transistor (ATr) is connected to said first bit line (BL), and a second memory cell in which said access transistor (ATr) is connected to said second bit line (/BL), said memory array portion includes a first reference potential applying means for providing a reference potential to said first bit line (BL) and a second reference potential applying means for providing reference potential to said second bit line (/BL), said semiconductor memory device further comprising a program unit (6) which programs a combination of signals to be provided to control lines (DWLO, DWL1) of said charge line (CL), said word line (WL), and the first and second reference potential applying means and uses the plurality of said memory cells (MC) as a 1-bit 2-cell type memory cells for memorizing 1-bit information with two memory cells or 1-bit 1-cell type memory cells for memorizing 1-bit information with a memory cell.

23. The semiconductor memory device according to claim 22 wherein said memory array portion is divided to a plurality of memory array blocks (MCA0 to MCA7) capable of accessing a low address independently and said program unit (6) is capable of setting said program to said 1-bit 2-cell type or said 1-bit 1-cell type for each of said plurality of memory array blocks.

24. The semiconductor memory device according to claim 22 wherein said memory array portion is divided to a plurality of memory array blocks (MCA0 to MCA7) capable of accessing a low address independently and said program unit (6) is capable of setting said program partially to the 1-bit 2-cell type or the 1-bit 1-cell type for each of the plurality of said memory array blocks.

* * * * *